(12) United States Patent
Maeda et al.

(10) Patent No.: US 11,442,357 B2
(45) Date of Patent: Sep. 13, 2022

(54) MASK BLANK, PHASE-SHIFT MASK, AND METHOD OF MANUFACTURING SEMICONDUCTOR DEVICE

(71) Applicant: HOYA CORPORATION, Tokyo (JP)

(72) Inventors: Hitoshi Maeda, Tokyo (JP); Hiroaki Shishido, Tokyo (JP); Masahiro Hashimoto, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 0 days.

(21) Appl. No.: 17/058,631

(22) PCT Filed: May 8, 2019

(86) PCT No.: PCT/JP2019/018396
§ 371 (c)(1),
(2) Date: Nov. 24, 2020

(87) PCT Pub. No.: WO2019/230313
PCT Pub. Date: Dec. 5, 2019

(65) Prior Publication Data
US 2021/0208497 A1 Jul. 8, 2021

(30) Foreign Application Priority Data
May 30, 2018 (JP) .............................. JP2018-103482

(51) Int. Cl.
*G03F 1/26* (2012.01)
*H01L 21/033* (2006.01)
(52) U.S. Cl.
CPC ............ *G03F 1/26* (2013.01); *H01L 21/0332* (2013.01); *H01L 21/0337* (2013.01)

(58) Field of Classification Search
CPC ..... G03F 1/26; G03F 1/32; G03F 7/20; G03F 1/58; H01L 21/0332; H01L 21/0337
(Continued)

(56) References Cited

U.S. PATENT DOCUMENTS

| 5,514,499 A | 5/1996 | Iwamatsu et al. |
| 5,629,115 A | 5/1997 | Kawano et al. |

(Continued)

FOREIGN PATENT DOCUMENTS

| JP | H07134392 A | 5/1995 |
| JP | H07159981 A | 6/1995 |

(Continued)

OTHER PUBLICATIONS

PCT/JP2019/018396, English Translation of International Search Report, dated Jul. 16, 2019, 2 pages.
(Continued)

*Primary Examiner* — Lan Vinh
(74) *Attorney, Agent, or Firm* — Kilpatrick Townsend & Stockton LLP

(57) ABSTRACT

Provided is a mask blank, including a phase shift film. The phase shift film has a structure where a first layer and a second layer are stacked in this order from a side of the transparent substrate. The first layer is provided in contact with a surface of the transparent substrate. Refractive indexes $n_1$ and $n_2$ of the first layer and the second layer, respectively, at a wavelength of an exposure light of an ArF excimer laser satisfy the relation $n_1 < n_2$. Extinction coefficients $k_1$ and $k_2$ of the first layer and the second layer, respectively, at a wavelength of the exposure light satisfy the relation $k_1 < k_2$. Film thicknesses $d_1$ and $d_2$ of the first layer and the second layer, respectively, satisfy the relation $d_1 < d_2$.

20 Claims, 3 Drawing Sheets

(58) Field of Classification Search
USPC .......... 216/41, 45, 48; 430/270.1, 321, 323
See application file for complete search history.

(56) References Cited

U.S. PATENT DOCUMENTS

| | | | |
|---|---|---|---|
| 5,935,735 | A | 8/1999 | Okubo et al. |
| 2012/0075603 | A1 | 3/2012 | Hansen et al. |
| 2014/0327117 | A1* | 11/2014 | Bencher ............ H01L 21/02266 257/649 |
| 2015/0125785 | A1 | 5/2015 | Inazuki et al. |
| 2015/0338731 | A1 | 11/2015 | Nozawa et al. |
| 2018/0143528 | A1* | 5/2018 | Nozawa .............. H01L 21/0274 |
| 2018/0259841 | A1* | 9/2018 | Nozawa .................... G03F 1/74 |
| 2019/0187551 | A1 | 6/2019 | Iwashita et al. |

FOREIGN PATENT DOCUMENTS

| | | |
|---|---|---|
| JP | H10186632 A | 7/1998 |
| JP | 2012074695 A | 4/2012 |
| JP | 5054766 A | 8/2012 |
| JP | 2014137388 A | 7/2014 |
| JP | 2014145920 A | 8/2014 |
| JP | 2015225182 A | 12/2015 |
| JP | 2018063441 A | 4/2018 |
| WO | 2018037864 A1 | 3/2018 |

OTHER PUBLICATIONS

Application No. SG11202010535Y, "Invitation to Respond to Written Opinion", dated Sep. 16, 2021, 8 pages.
SG11202010535Y, "Invitation to Respond to Written Opinion", dated Jul. 26, 2022, 9 pages.

* cited by examiner

[Fig. 1]
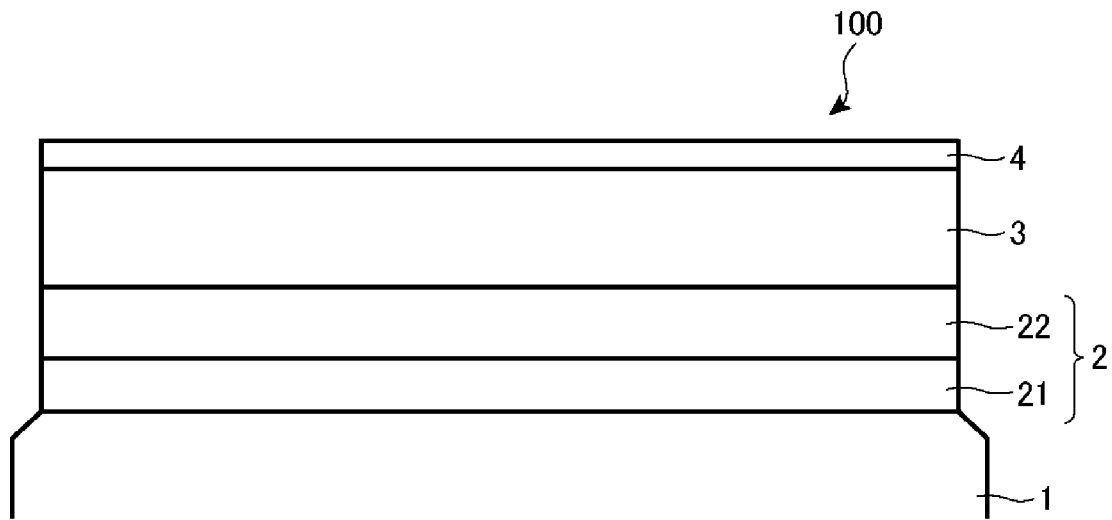
[Fig. 2]
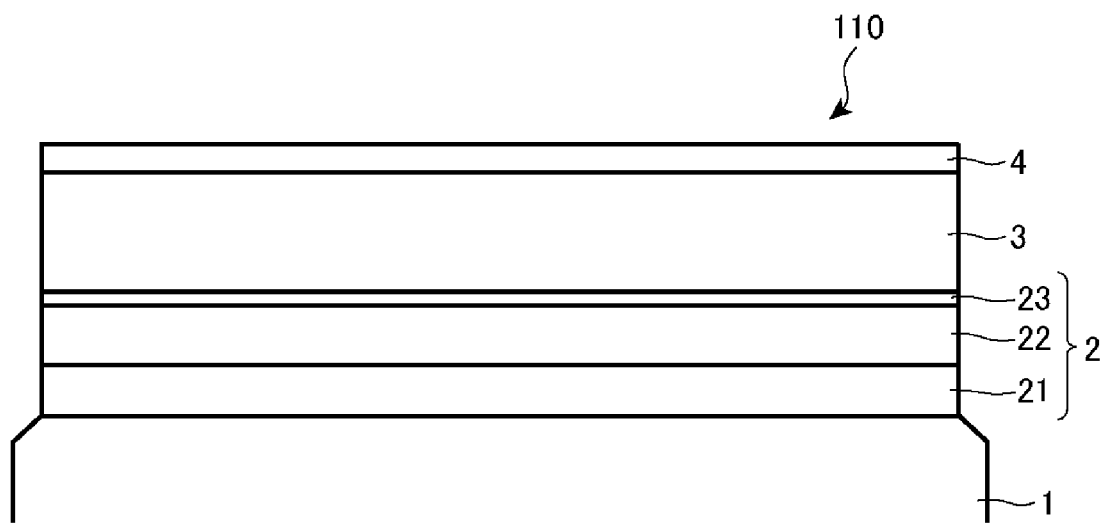

[Fig. 3]
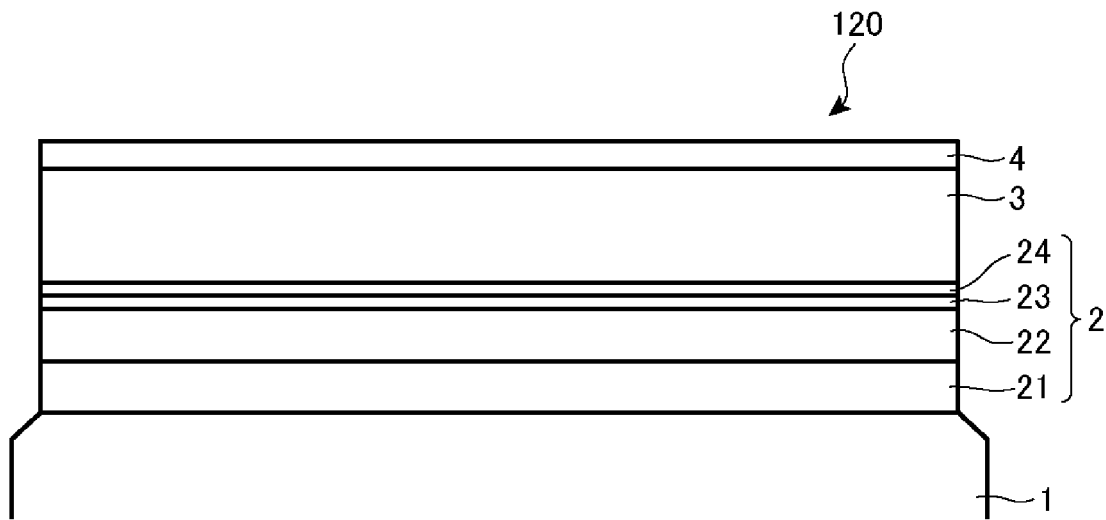
[Fig. 4]
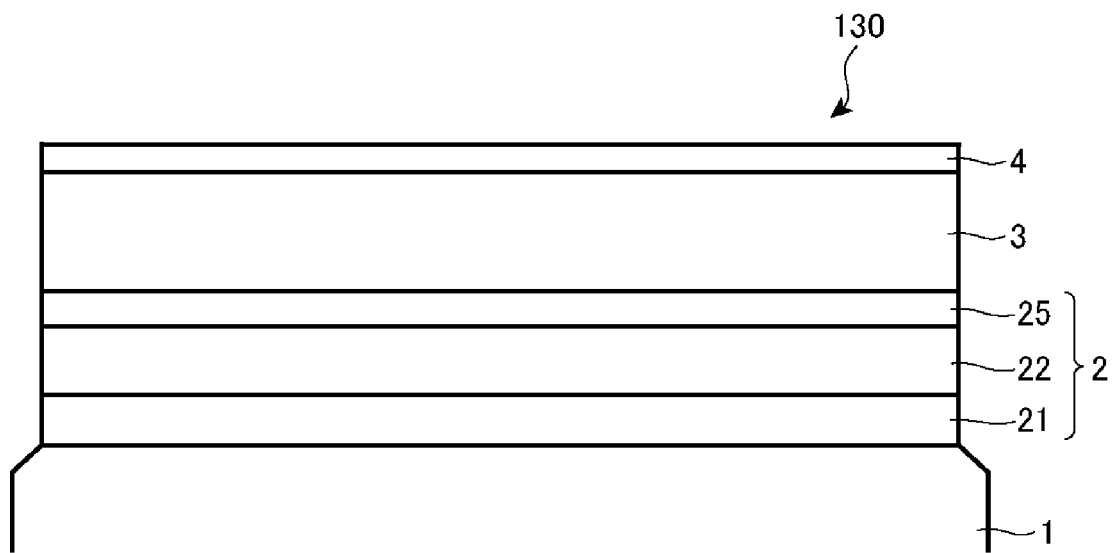

MASK BLANK, PHASE-SHIFT MASK, AND METHOD OF MANUFACTURING SEMICONDUCTOR DEVICE

CROSS-REFERENCE TO RELATED APPLICATIONS

This application is a National Stage of International Application No. PCT/JP2019/018396, filed May 8, 2019, which claims priority to Japanese Patent Application No. 2018-103482, filed May 30, 2018, and the contents of which is incorporated by reference.

TECHNICAL FIELD

This disclosure relates to a mask blank and a phase shift mask manufactured using the mask blank. This disclosure further relates to a method of manufacturing a semiconductor device using the phase shift mask.

BACKGROUND ART

Generally, in a manufacturing process of a semiconductor device, photolithography is used to form a fine pattern. Multiple substrates called transfer masks are usually utilized in forming the fine pattern. In order to miniaturize a pattern of a semiconductor device, in addition to miniaturization of a mask pattern formed in a transfer mask, it is necessary to shorten a wavelength of an exposure light source used in photolithography. Shortening of wavelength has been advancing recently from the use of KrF excimer laser (wavelength 248 nm) to ArF excimer laser (wavelength 193 nm) as an exposure light source in the manufacture of a semiconductor device.

As for the types of transfer masks, a half tone phase shift mask is known in addition to a conventional binary mask having a light shielding pattern made of a chromium-based material on a transparent substrate.

Patent Document 1 discloses a binary mask blank including a light shielding film and front and back surface reflectance preventing films. Patent Document 1 includes a back surface anti-reflection film formed in contact below a light shielding film and which includes silicon, a transition metal, oxygen, and nitrogen, and in which a refractive index $n_2$ of the film is 1.0-3.5, an extinction coefficient of the film $k_2$ is 2.5 or less, and a film thickness t2 is 5-40 nm for suppressing flare affecting adjacent shots caused by a reflection from a light shielding band, and dose error in a pattern area. In Patent Document 1, a binary mask blank is achieved having a reflectance to an incident of light from a transparent substrate side (hereinafter referred to as back surface reflectance) of about 30% or less, specifically, about 29% or about 23% as shown in the examples.

Patent Document 2 discloses a half tone phase shift mask blank provided with a phase shift film on a transparent substrate, which has a function to transmit an ArF exposure light at a predetermined transmittance and to generate a predetermined amount of phase shift to the transmitting ArF exposure light. The phase shift film of Patent Document 2 has a stacked structure including a high transmission layer and a low transmission layer. Further, a SiN-based film having a relatively high nitrogen content is applied to the high transmission layer, and a SiN-based film having a relatively low nitrogen content is applied to the low transmission layer.

Recently, an illumination system used in exposure-transferring a resist film on a semiconductor device is showing increased advancement and complication. Patent Document 3 discloses a method for configuring an illumination source of a lithographic apparatus to enhance the imaging of a mask pattern onto a substrate. The method includes six steps given below. (1) Dividing the illumination source into pixel groups, each pixel group including one or more illumination source points in a pupil plane of the illumination source. (2) Changing a polarization state of each pixel group and determining an incremental effect on each of the plurality of critical dimensions resulting from the change of polarization state of each pixel group. (3) Calculating a first plurality of sensitivity coefficients for each of the plurality of critical dimensions using the determined incremental effects. (4) Selecting an initial illumination source. (5) Iteratively calculating a lithographic metric as a result of a change of polarization state of a pixel group in the initial illumination source using the calculated first plurality of sensitivity coefficients, the change of the polarization state of the pixel group in the initial illumination source creating a modified illumination source. (6) Adjusting the initial illumination source based on the iterative results of calculations.

PRIOR ART PUBLICATIONS

Patent Documents

Patent Document 1
  Japanese Patent No. 5054766
Patent Document 2
  Japanese Patent Application Publication 2014-137388
Patent Document 3
  Japanese Patent Application Publication 2012-74695

SUMMARY OF THE DISCLOSURE

Problems to be Solved by the Disclosure

Recently, there are demands for further miniaturization of transfer patterns, and an illumination system used in exposure transfer is also showing increased advancement and complication. For example, the illumination system of Patent Document 3 is controlled to optimize the position and angle of an illumination source. In the case of exposing a transfer mask with an exposure light of an ArF excimer laser with a relatively short wavelength in such a complicated illumination system, a stray light is likely to generate, which is caused by multiple reflections in a transparent substrate of the transfer mask. The stray light reaching bar codes and alignment marks provided outside of a pattern forming region on a transparent substrate of a transfer mask in exposure-transferring a resist film on a semiconductor device causes the bar codes and alignment marks to be projected onto the resist film on the semiconductor device. This phenomenon causes CD variations on the resist film of the semiconductor device. Since bar codes and alignment marks formed on a thin film on a transparent substrate are essential for identification and registration of transfer masks, their removal is not realistic. Further, an illumination system used for an exposure transfer is generally provided with a shutter mechanism to block an external area of an exposure region of a transfer mask from being irradiated by an exposure light. However, due to increasing oblique incidence component of an exposure light by the aforementioned optimization of position and angle of an illumination source, it is difficult to suppress a stray light caused by multiple reflections of an exposure light irradiated into an exposure region of a transfer mask onto an external area of an exposure region in a transparent substrate. Due to such a circumstance, it is becoming difficult to satisfy further demand of miniaturization of a transfer pattern in a mask blank having a back surface reflectance of about 30%, which was conventionally accepted.

This disclosure was made to solve a conventional problem. The aspect of the disclosure is to provide a mask blank having a phase shift film on a transparent substrate, the phase shift film having a function to transmit an exposure light of an ArF excimer laser at a predetermined transmittance and a function to generate a predetermined phase difference to the transmitting exposure light of the ArF excimer laser, the phase shift film further having a reduced back surface reflectance. A further aspect is to provide a phase shift mask manufactured using this mask blank. Yet another aspect of this disclosure is to provide a method of manufacturing a semiconductor device using such a phase shift mask.

Means for Solving the Problem

For solving the above problem, this disclosure includes the following configurations.

(Configuration 1)

A mask blank including a phase shift film on a transparent substrate, in which the phase shift film has a structure where a first layer and a second layer are stacked in this order from a side of the transparent substrate, in which the first layer is provided in contact with a surface of the transparent substrate, in which refractive indexes $n_1$ and $n_2$ of the first layer and the second layer, respectively, at a wavelength of an exposure light of an ArF excimer laser satisfy a relation of $n_2<n_2$, in which extinction coefficients $k_1$ and $k_2$ of the first layer and the second layer, respectively, at a wavelength of the exposure light satisfy a relation of $k_1<k_2$, and in which film thicknesses $d_1$ and $d_2$ of the first layer and the second layer, respectively, satisfy a relation of $d_1<d_2$.

(Configuration 2)

The mask blank according to Configuration 1, in which a refractive index $n_1$ of the first layer is 1.8 or more and an extinction coefficient $k_1$ of the first layer is 0.15 or less.

(Configuration 3)

The mask blank according to Configuration 1 or 2, in which a refractive index $n_2$ of the second layer is 2.2 or more and an extinction coefficient $k_2$ of the second layer is 0.2 or more.

(Configuration 4)

The mask blank according to any of Configurations 1 to 3, in which a refractive index $n_S$ of the transparent substrate at a wavelength of the exposure light satisfies a relation of $n_S<n_1<n_2$, and in which an extinction coefficient $k_S$ of the transparent substrate at a wavelength of the exposure light satisfies a relation of $k_S<k_1<k_2$.

(Configuration 5)

The mask blank according to Configuration 4, in which a refractive index $n_S$ of the transparent substrate is 1.6 or less and an extinction coefficient $k_S$ of the transparent substrate is 0.01 or less.

(Configuration 6)

The mask blank according to any of Configurations 1 to 5, in which the phase shift film has a function to transmit the exposure light at a transmittance of 15% or more, and a function to generate a phase difference of 150 degrees or more and 200 degrees or less between the exposure light transmitted through the phase shift film and the exposure light transmitted through the air for a same distance as a thickness of the phase shift film.

(Configuration 7)

The mask blank according to any of Configurations 1 to 6, in which the first layer is formed from a material including silicon, nitrogen, and oxygen, or a material including silicon, nitrogen, oxygen, and one or more elements selected from a metalloid element and a non-metallic element, and in which the second layer is formed from a material including silicon and nitrogen, or a material including silicon, nitrogen, and one or more elements selected from a metalloid element and a non-metallic element.

(Configuration 8)

The mask blank according to Configuration 7, in which a nitrogen content of the second layer is more than a nitrogen content of the first layer.

(Configuration 9)

The mask blank according to any of Configurations 1 to 8, in which the phase shift film includes a third layer on the second layer, in which a refractive index $n_3$ of the third layer at a wavelength of the exposure light satisfies a relation of $n_3<n_1<n_2$, and in which an extinction coefficient $k_3$ of the third layer at a wavelength of the exposure light satisfies a relation of $k_1<k_2<k_3$.

(Configuration 10)

The mask blank according to Configuration 9, in which a film thickness $d_3$ of the third layer satisfies a relation of $d_3<d_1<d_2$.

(Configuration 11)

The mask blank according to Configuration 9 or 10, in which a refractive index $n_3$ of the third layer is less than 1.8, and an extinction coefficient $k_3$ of the third layer is 1.0 or more.

(Configuration 12)

The mask blank according to any of Configurations 9 to 11, in which the third layer is formed from a material including silicon and nitrogen, or a material including silicon, nitrogen, and one or more elements selected from a metalloid element and a non-metallic element.

(Configuration 13)

The mask blank according to any of Configurations 9 to 12, in which the phase shift film includes a fourth layer on the third layer, in which a refractive index $n_4$ of the fourth layer at a wavelength of the exposure light satisfies a relation of $n_4<n_1<n_2$, and in which an extinction coefficient $k_4$ of the fourth layer at a wavelength of the exposure light satisfies a relation of $k_4<k_1<k_2$.

(Configuration 14)

The mask blank according to Configuration 13, in which a refractive index $n_4$ of the fourth layer is 1.7 or less and an extinction coefficient $k_4$ of the fourth layer is 0.02 or less.

(Configuration 15)

The mask blank according to Configuration 13 or 14, in which the fourth layer is formed from a material including silicon and oxygen, or a material including silicon, oxygen, and one or more elements selected from a metalloid element and a non-metallic element.

(Configuration 16)

The mask blank according to any of Configurations 1 to 8, in which the phase shift film includes a third A layer on the second layer, in which a refractive index $n_{3A}$ of the third A layer at a wavelength of the exposure light satisfies a relation of $n_{3A}<n_1<n_2$, and in which an extinction coefficient $k_{3A}$ of the third A layer at a wavelength of the exposure light satisfies a relation of $k_{3A}<k_1<k_2$.

(Configuration 17)

The mask blank according to Configuration 16, in which a refractive index $n_{3A}$ of the third A layer is 1.7 or less, and an extinction coefficient $k_{3A}$ of the third A layer is 0.02 or less.

(Configuration 18)

The mask blank according to Configuration 16 or 17, in which the third A layer is formed from a material including silicon and oxygen, or a material including silicon, oxygen, and one or more elements selected from a metalloid element and a non-metallic element.

(Configuration 19)

A phase shift mask provided with a transfer pattern on the phase shift film of the mask blank according to any of Configurations 1 to 18.

(Configuration 20)

A method of manufacturing a semiconductor device including the step of using the phase shift mask according to Configuration 19 and subjecting a resist film on a semiconductor substrate to exposure transfer of a transfer pattern.

Effect of the Disclosure

Provided in this disclosure is a mask blank including a phase shift film on a transparent substrate, the phase shift film having a function to transmit an exposure light of an ArF excimer laser at a predetermined transmittance and a function to generate a predetermined phase difference to the transmitting exposure light of an ArF excimer laser, and in which the phase shift film has a reduced back surface reflectance.

BRIEF DESCRIPTION OF THE DRAWINGS

FIG. 1 is a cross-sectional view showing a configuration of the mask blank of the first embodiment of this disclosure.

FIG. 2 is a cross-sectional view showing a configuration of the mask blank of the second embodiment of this disclosure.

FIG. 3 is a cross-sectional view showing a configuration of the mask blank of the third embodiment of this disclosure.

FIG. 4 is a cross-sectional view showing a configuration of the mask blank of the fourth embodiment of this disclosure.

EMBODIMENTS FOR CARRYING OUT THE DISCLOSURE

Figure 5A:
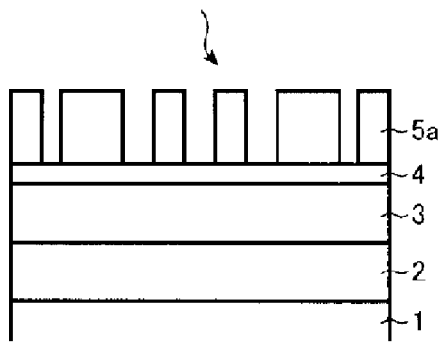
FIGS. 5A-5G are a schematic cross-sectional views showing a manufacturing process of the phase shift mask according to the first to fourth embodiments of this disclosure.
Figure 5E:
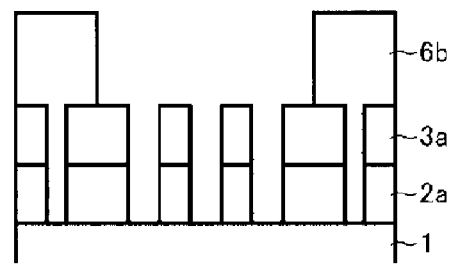

The embodiments of this disclosure are explained below. The inventors of this application diligently studied a phase shift film regarding means that can further reduce a back surface reflectance, while having both of a function to transmit an exposure light of an ArF excimer laser (hereafter may be simply referred to as an exposure light) at a predetermined transmittance and a function to generate a predetermined phase difference.

A stray light that generates upon an exposure on a transfer mask is considered as caused by a light in which a part of an exposure light entered from a surface (back surface) of a back side (side without a phase shift film) of a transparent substrate of a phase shift mask is reflected at an interface between the transparent substrate and the phase shift film, further reflected again at an interface between the back surface of the transparent substrate and the air, and exited from a region without the phase shift film on a surface of the front side of the transparent substrate. To suppress the projection of bar codes and alignment marks that generates by the stray light, a light intensity of the stray light to a light intensity of the exposure light that is irradiated on the transparent substrate is preferably 0.2% or less. In a phase shift mask, a light shielding band (stacked structure of a phase shift film and a light shielding film) provided on a peripheral region of a region at which a transfer pattern is formed is considered as preferably having a transmittance of 0.2% or less. With such a transmittance, it is considered that there is substantially no influence of a transmitting exposure light on CD variation of a resist film on a semiconductor device.

In exposing a phase shift mask with an exposure light of an ArF excimer laser, upon the exposure light entering a back surface of a transparent substrate from the air, a light that reflects on the back surface of the transparent substrate generates, which is about 5% of the entering light (i.e., light intensity of the exposure light entering the interior of the transparent substrate is reduced by about 5%). Further, when a part of an exposure light reflected at an interface between a transparent substrate and a phase shift film is reflected at an interface between a back surface of the transparent substrate and the air, the part of the light is not reflected and exits from the back surface. As a result of examining these points, the inventors reached an idea that in the state where only a phase shift film exists on a transparent substrate, a reflectance at the transparent substrate side (back surface side) to an exposure light (back surface reflectance) of 9% or less can make a light intensity of a stray light 0.2% or less, and can suppress projection of bar codes and alignment marks.

Incidentally, in actually measuring a back surface reflectance of a phase shift film, a measuring light is irradiated on a transparent substrate on a surface that is opposite to the side to which a phase shift film is provided (back surface), a light intensity of the reflected light is measured, and a back surface reflectance is calculated from the light intensity of the reflected light. The light intensity of the measured reflected light is the light intensity of a light including at least a light reflected at an interface between the air and the transparent substrate, and a light in which the measurement light that was not reflected at the interface and entered the transparent substrate is reflected at an interface between the transparent substrate and the phase shift film, and further exited into the air without being reflected again at an interface between the back surface of the transparent substrate and the air (a light slightly less than 4% of the light entered the interface). Namely, the back surface reflectance of 9% or less is a back surface reflectance that is calculated by a light including reflected lights other than light reflected at the interface between the transparent substrate and the phase shift film.

The inventors of this application studied a configuration of a mask blank including a phase shift film for achieving a back surface reflectance of 9% or less, while having both of a function to transmit an exposure light of an ArF excimer laser at a predetermined transmittance and a function to generate a predetermined phase difference.

A conventional material for forming a phase shift film preferably has a refractive index n as large as possible, and an extinction coefficient k within a scope that is not too large and not too small. This is because the major design concept of the conventional phase shift film is to transmit an exposure light of an ArF excimer laser at a predetermined transmittance by absorbing the exposure light of an ArF excimer laser inside of the phase shift film, while generating a predetermined phase difference to the transmitting exposure light of an ArF excimer laser. In a phase shift film of a single layer structure, it is difficult to achieve a back surface reflectance of 9% or less while having a function required for the phase shift film (function to generate a predetermined transmittance and phase difference to an exposure light of an ArF excimer laser that transmits through the phase shift film). The inventors of this application studied constructing a phase shift film from a plurality of layers and achieving, throughout the layers as a whole, a back surface reflectance of 9% or less, while having both of a function to transmit an exposure light of an ArF excimer laser at a predetermined transmittance and a function to generate a predetermined phase difference. To reduce a back surface reflectance of a phase shift film to an exposure light of an ArF excimer laser, it is necessary to utilize an interference effect of a reflected light at an interface between the transparent substrate and the phase shift film, and a reflected light at an interface between the layers constructing the phase shift film.

As a result of considering these points, the inventors found out that a phase shift film achieving a back surface reflectance of 9% or less while having a predetermined transmittance and predetermined phase difference to an exposure light of an ArF excimer laser can be formed by constructing a phase shift film from a first layer and a second layer stacked in this order from a transparent substrate side, providing the first layer in contact with a surface of the transparent substrate, and adjusting refractive indexes $n_1$ and $n_2$, extinction coefficients $k_1$ and $k_2$, and film thicknesses $d_1$ and $d_2$ of the first layer and the second layer in a wavelength of an exposure light of an ArF excimer laser. This disclosure has been made as a result of the diligent studies described above. In the explanation herebelow, the values of refractive index, extinction coefficient, transmittance, and phase difference are values relative to an exposure light of an ArF excimer laser, unless particularly noted.

FIG. 1 is a cross-sectional view showing a configuration of a mask blank 100 of the first embodiment of this disclosure. The mask blank 100 of this disclosure shown in FIG. 1 has a structure where a phase shift film 2, a light shielding film 3, and a hard mask film 4 are stacked in this order on a transparent substrate 1.

The transparent substrate 1 can be made of quartz glass, aluminosilicate glass, soda-lime glass, low thermal expansion glass ($SiO_2$—$TiO_2$ glass, etc.), etc., in addition to synthetic quartz glass. Among the above, synthetic quartz glass is particularly preferable as a material for forming the transparent substrate 1 of the mask blank for having a high transmittance to an ArF excimer laser light.

A refractive index $n_S$ of the transparent substrate 1 is preferably 1.6 or less, more preferably 1.59 or less, and even more preferably 1.58 or less. On the other hand, a refractive index $n_S$ of the transparent substrate 1 is preferably 1.5 or more, more preferably 1.52 or more, and even more preferably 1.54 or more. Further, an extinction coefficient $k_S$ of the transparent substrate 1 is preferably 0.01 or less. Incidentally, the lower limit of an extinction coefficient $k_S$ of the transparent substrate 1 is 0.00.

To generate a sufficient phase shift effect between the exposure light transmitted through the interior of the phase shift film 2 and the exposure light transmitted through the air, a transmittance to an exposure light of the phase shift film 2 is preferably 15% or more, and more preferably 16% or more. On the other hand, a transmittance of the phase shift film 2 to an exposure light is preferably 40% or less, and more preferably 36% or less.

To obtain a proper phase shift effect, it is desirable for the phase shift film 2 to be adjusted such that a phase difference that generates between the transmitting exposure light of an ArF excimer laser and the light that transmitted through the air for the same distance as a thickness of the phase shift film 2 is within the range of 150 degrees or more and 200 degrees or less. The lower limit of the phase difference of the phase shift film 2 is preferably 155 degrees or more, and more preferably 160 degrees or more. On the other hand, the upper limit of the phase difference in the phase shift film 2 is preferably 190 degrees or less.

It is preferable that the phase shift film 2 in the state where only the phase shift film 2 is present on the transparent substrate 1 has 9% or less back surface reflectance to an exposure light of an ArF excimer laser.

The phase shift film 2 has a structure where a first layer 21 and a second layer 22 are stacked from the transparent substrate 1 side. It is required to at least satisfy each condition of the transmittance, the phase difference, and the back surface reflectance given above in the entire phase shift film 2. For the phase shift film 2 to satisfy each of the above conditions, the inventors of this application found out that a refractive index $n_1$ of the first layer 21 and a refractive index $n_2$ of the second layer 22 should satisfy a relation of $n_1 < n_2$, and an extinction coefficient $k_1$ of the first layer 21 and an extinction coefficient $k_2$ of the second layer 22 should satisfy a relation of $k_1 < k_2$.

In addition, a refractive index $n_1$ of the first layer 21 is preferably 1.8 or more, and more preferably 1.85 or more. Further, a refractive index $n_1$ of the first layer 21 is preferably less than 2.2, and more preferably 2.15 or less. An extinction coefficient $k_1$ of the first layer 21 is preferably 0.15 or less, and more preferably 0.14 or less. Further, an extinction coefficient $k_1$ of the first layer 21 is preferably 0.05 or more, and more preferably 0.06 or more. A refractive index $n_1$ and an extinction coefficient $k_1$ of the first layer 21 are values derived by regarding the entire first layer 21 as a single, optically uniform layer.

Further, it is preferable that a refractive index $n_S$ of the transparent substrate 1, a refractive index $n_1$ of the first layer 21, and a refractive index $n_2$ of the second layer 22 satisfy a relation of $n_S < n_1 < n_2$, and an extinction coefficient $k_S$ of the transparent substrate 1, an extinction coefficient $k_1$ of the first layer 21, and an extinction coefficient $k_2$ of the second layer 22 satisfy a relation of $k_S < k_1 < k_2$.

For the phase shift film 2 to satisfy the above conditions, a refractive index $n_2$ of the second layer 22 is preferably 2.2 or more, and more preferably 2.25 or more. Further, a refractive index $n_2$ of the second layer 22 is preferably 3.0 or less, and more preferably 2.8 or less. Further, an extinction coefficient $k_2$ of the second layer 22 is preferably 0.2 or more, and more preferably 0.25 or more. Further, an extinction coefficient $k_2$ of the second layer 22 is preferably 0.5 or less, and more preferably 0.4 or less. A refractive index $n_2$ and an extinction coefficient $k_2$ of the second layer 22 are values derived by regarding the entire second layer 22 as a single, optically uniform layer.

A refractive index n and an extinction coefficient k of a thin film including the phase shift film 2 are not determined only by the composition of the thin film. Film density and crystal condition of the thin film are also the factors that affect a refractive index n and an extinction coefficient k. Therefore, the conditions in forming a thin film by reactive sputtering are adjusted so that the thin film reaches desired refractive index n and extinction coefficient k. For allowing the first layer and the second layer to have a refractive index n and an extinction coefficient k of the above range, not only the ratio of mixed gas of noble gas and reactive gas (oxygen gas, nitrogen gas, etc.) is adjusted in forming a film by reactive sputtering, but various other adjustments are made upon forming a film by reactive sputtering, such as pressure in a film forming chamber, power applied to the sputtering target, and positional relationship such as distance between the target and the transparent substrate 1. Further, these film forming conditions are specific to film forming apparatuses, and are adjusted arbitrarily for the first layer 21 and the second layer 22 to be formed to achieve desired refractive index n and extinction coefficient k.

Further, for the phase shift film 2 to satisfy each of the above conditions, it is at least necessary that, in addition to the optical properties of the first layer 21 and the second layer 22, a film thickness $d_1$ of the first layer 21 and a film thickness $d_2$ of the second layer 22 satisfy a relation of $d_1 < d_2$. A film thickness $d_1$ of the first layer 21 is preferably 33 nm or less, and more preferably 32 nm or less. Further, a film thickness $d_1$ of the first layer 21 is preferably greater than 10 nm, and more preferably 15 nm or more.

A film thickness $d_2$ of the second layer 22 is preferably 33 nm or more, and more preferably 34 nm or more. A film thickness $d_2$ of the second layer 22 is preferably 50 nm or less, and more preferably 48 nm or less.

The first layer 21 is preferably formed from a material including silicon, nitrogen, and oxygen, or a material including silicon, nitrogen, oxygen, and one or more elements selected from metalloid elements and non-metallic elements. Further, the second layer 22 is preferably formed from a material including silicon and nitrogen, or a material formed from silicon, nitrogen, and one or more elements selected from metalloid elements and non-metallic elements. Among these metalloid elements, it is preferable to include one or more elements selected from boron, germanium, antimony, and tellurium, since enhancement in conductivity of silicon to be used as a sputtering target can be expected. Among these non-metallic elements, it is preferable to include one or more elements selected from nitrogen, carbon, fluorine, and hydrogen. These non-metallic elements include noble gas such as helium (He), argon (Ar), krypton (Kr), and xenon (Xe).

It is preferable that a nitrogen content of the second layer 22 is greater than a nitrogen content of the first layer 21. A nitrogen content of the first layer 21 is preferably 40 atom % or less, and more preferably 30 atom % or less. Further, a nitrogen content of the first layer 21 is preferably 10 atom % or more, and more preferably 15 atom % or more. On the other hand, a nitrogen content of the second layer 22 is preferably 45 atom % or more, more preferably 50 atom % or more, and even more preferably 55 atom % or more. This is because, while the second layer 22 is preferably formed from a material having a high refractive index, increasing a nitrogen content can increase a refractive index.

An oxygen content of the first layer 21 is preferably greater than an oxygen content of the second layer 22. An oxygen content of the first layer 21 is preferably 10 atom % or more, and more preferably 15 atom % or more. Further, an oxygen content of the first layer 21 is preferably 45 atom % or less, and more preferably 40 atom % or less. On the other hand, an oxygen content of the second layer 22 is preferably 5 atom % or less, and more preferably 2 atom % or less. It is further preferable that the second layer 22 is free of oxygen. This is because as an oxygen content in the second layer 22 increases, a refractive index of the second layer 22 decreases.

The first layer 21 is formed in contact with a surface of the transparent substrate 1. This is because a configuration where the first layer 21 contacts the surface of the transparent substrate 1 can obtain greater effect of reducing a back surface reflectance that is generated by the stacked structure of the first layer 21 and the second layer of the phase shift film 2.

While the first layer 21 and the second layer 22 of the phase shift film 2 are formed through sputtering, any sputtering including DC sputtering, RF sputtering, ion beam sputtering, etc. is applicable. Application of DC sputtering is preferable, considering the film forming rate. In the case where the target has low conductivity, while application of RF sputtering and ion beam sputtering is preferable, application of RF sputtering is more preferable considering the film forming rate.

The mask blank 100 has a light shielding film 3 on the phase shift film 2. Generally, in a binary mask, an outer peripheral region of a region where a transfer pattern is formed (transfer pattern forming region) is desired to ensure an optical density (OD) of a predetermined value or more to prevent the resist film from being subjected to an influence of an exposure light that transmitted through the outer peripheral region when an exposure transfer was made on a resist film on a semiconductor wafer using an exposure apparatus. This point is similar in the case of a phase shift mask. Generally, the outer peripheral region of a transfer mask including a phase shift mask preferably has an OD of 2.7 or more. The phase shift film 2 has a function to transmit an exposure light at a predetermined transmittance, and it is difficult to ensure an optical density of a predetermined value with the phase shift film 2 alone. Therefore, it is necessary to stack the light shielding film 3 on the phase shift film 2 at the stage of manufacturing the mask blank 100 to ensure lacking optical density. With such a configuration of the mask blank 100, the phase shift mask 200 ensuring a predetermined value of optical density on the outer peripheral region can be manufactured by removing the light shielding film 3 of the region which uses the phase shifting effect (basically transfer pattern forming region) during manufacture of the phase shift mask 200 (see FIGS. 5A-5G).

A single layer structure and a stacked structure of two or more layers are applicable to the light shielding film 3. Further, each layer in the light shielding film 3 of a single layer structure and the light shielding film 3 with a stacked structure of two or more layers may be configured by approximately the same composition in the thickness direction of the layer or the film, or with a composition gradient in the thickness direction of the layer.

The mask blank 100 of the embodiment shown in FIG. 1 is configured as a structure where the light shielding film 3 is stacked on the phase shift film 2 without an intervening film. For the light shielding film 3 of this configuration, it is necessary to apply a material having a sufficient etching selectivity to etching gas used in forming a pattern in the phase shift film 2. The light shielding film 3 in this case is preferably formed from a material containing chromium.

Materials containing chromium for forming the light shielding film 3 can include, in addition to chromium metal, a material containing chromium and one or more elements selected from oxygen, nitrogen, carbon, boron, and fluorine.

While a chromium-based material is generally etched by mixed gas of chlorine-based gas and oxygen gas, an etching rate of the chromium metal to the etching gas is not as high. Considering enhancing an etching rate of mixed gas of chlorine-based gas and oxygen gas to etching gas, the material forming the light shielding film 3 preferably contains chromium and one or more elements selected from oxygen, nitrogen, carbon, boron, and fluorine. Further, one or more elements among molybdenum, indium, and tin can be included in the material containing chromium for forming the light shielding film 3. Including one or more elements among molybdenum, indium, and tin can increase an etching rate to mixed gas of chlorine-based gas and oxygen gas.

The light shielding film 3 can be made of a material containing a transition metal and silicon, if an etching selectivity to dry etching can be obtained between the material forming the second layer 22. This is because a material containing a transition metal and silicon has high light shielding performance, which enables reduction of the thickness of the light shielding film 3. The transition metal to be included in the light shielding film 3 includes one metal among molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), zinc (Zn), niobium (Nb), palladium (Pd), etc., or an alloy of these metals. Metal elements other than the transition metal elements to be included in the light shielding film 3 include aluminum (Al), indium (In), tin (Sn), gallium (Ga), etc.

On the other hand, as a mask blank 100 of another embodiment, a light shielding film 3 of a structure including a layer of a material including chromium and a layer of a material including transition metal and silicon stacked in this order from the phase shift film 2 side can be provided. Concrete matters on the material containing chromium and the material containing transition metal and silicon in this case are similar to the case of the light shielding film 3 described above.

It is preferable that the mask blank 100 in the state where the phase shift film 2 and the light shielding film 3 are stacked has a back surface reflectance of 9% or less to an exposure light of an ArF excimer laser.

In the mask blank 100, a preferable configuration is that the light shielding film 3 has further stacked thereon a hard mask film 4 formed from a material having etching selectivity to an etching gas used in etching the light shielding film 3. Since the hard mask film 4 is basically not limited with regard to optical density, the thickness of the hard mask film 4 can be reduced significantly compared to the thickness of the light shielding film 3. Since a resist film of an organic material only requires a film thickness to function as an etching mask until dry etching for forming a pattern in the hard mask film 4 is completed, the thickness can be reduced significantly compared to conventional resist films. Reduction of film thickness of a resist film is effective for enhancing resist resolution and preventing collapse of pattern, which is extremely important in facing requirements for miniaturization.

In the case where the light shielding film 3 is formed from a material containing chromium, the hard mask film 4 is preferably formed from a material containing silicon. Since the hard mask film 4 in this case tends to have low adhesiveness with a resist film of an organic material, it is preferable to treat the surface of the hard mask film 4 with HMDS (Hexamethyldisilazane) to enhance surface adhesiveness. The hard mask film 4 in this case is more preferably formed from $SiO_2$, SiN, SiON, etc.

Further, in the case where the light shielding film 3 is formed from a material containing chromium, materials containing tantalum are also applicable as the materials of the hard mask film 4, in addition to the materials given above. The material containing tantalum in this case includes, in addition to tantalum metal, a material containing tantalum and one or more elements selected from nitrogen, oxygen, boron, and carbon, for example, Ta, TaN, TaO, TaON, TaBN, TaBO, TaBON, TaCN, TaCO, TaCON, TaBCN, TaBOCN, etc. Further, in the case where the light shielding film 3 is formed from a material containing silicon, the hard mask film 4 is preferably formed from the material containing chromium given above.

In the mask blank 100, a resist film formed from an organic material is preferably formed at a film thickness of 100 nm or less in contact with a surface of the hard mask film 4. In the case of a fine pattern to meet DRAM hp32 nm generation, a SRAF (Sub-Resolution Assist Feature) with 40 nm line width may be provided on a transfer pattern (phase shift pattern) to be formed in the hard mask film 4. However, even in this case, the cross-sectional aspect ratio of the resist pattern can be reduced down to 1:2.5 so that collapse and peeling off of the resist pattern can be prevented in rinsing and developing, etc. of the resist film. Incidentally, the resist film preferably has a film thickness of 80 nm or less.

FIG. 2 is a cross-sectional view showing a configuration of a mask blank 110 of the second embodiment of this disclosure. The mask blank 110 of this embodiment has a structure where a first layer 21, a second layer 22, and a third layer 23 are stacked from the transparent substrate 1 side. The preferable refractive indexes, extinction coefficients, and film thicknesses of the first layer 21 and the second layer 22 are as mentioned in the first embodiment, and their explanations are omitted. The configurations of the transparent substrate 1, the light shielding film 3, and the hard mask film 4 are as mentioned in the first embodiment.

The third layer 23 is preferably formed from of a material including silicon and nitrogen, or a material including silicon, nitrogen, and one or more elements selected from metalloid elements and non-metallic elements.

A refractive index $n_1$ of the first layer 21, a refractive index $n_2$ of the second layer 22, and a refractive index $n_3$ of the third layer 23 preferably satisfy a relation of $n_3<n_1<n_2$. Further, an extinction coefficient $k_1$ of the first layer 21, an extinction coefficient $k_2$ of the second layer 22, and an extinction coefficient $k_3$ of the third layer 23 preferably satisfy a relation of $k_1<k_2<k_3$. In addition to the above, a refractive index $n_3$ of the third layer 23 is preferably less than 1.8, and more preferably 1.75 or less. Further, a refractive index $n_3$ of the third layer 23 is preferably 1.0 or more, and more preferably 1.2 or more. An extinction coefficient $k_3$ of the third layer 23 is preferably 1.0 or more, and more preferably 1.2 or more. Further, an extinction coefficient $k_3$ of the third layer 23 is preferably 2.0 or less, and more preferably 1.8 or less.

A film thickness $d_1$ of the first layer 21, a film thickness $d_2$ of the second layer 22, and a film thickness $d_3$ of the third layer 23 preferably satisfy a relation of $d_3<d_1<d_2$. In addition to the above, a film thickness $d_3$ of the third layer 23 is preferably 10 nm or less, and more preferably 9 nm or less. Further, a film thickness $d_3$ of the third layer 23 is preferably 2 nm or more, and more preferably 3 nm or more.

It is preferable that a nitrogen content of the third layer 23 is less than a nitrogen content of the second layer 22. A nitrogen content of the third layer 23 is preferably 35 atom % or less, and more preferably 30 atom % or less. Further, a nitrogen content of the third layer 23 is preferably 5 atom % or more, and more preferably 10 atom % or more. An oxygen content of the third layer 23 is preferably less than an oxygen content of the first layer 21. An oxygen content of the third layer 23 is preferably 10 atom % or less, and more preferably 5 atom % or less.

By the above configuration, the mask blank 110 of this embodiment can generate substantially 180 degrees phase difference, and further reduction of a back surface reflectance is possible compared to the mask blank 100 of the first embodiment.

FIG. 3 is a cross-sectional view showing a configuration of a mask blank 120 of the third embodiment of this disclosure. The mask blank 120 of this embodiment has a structure where a first layer 21, a second layer 22, a third layer 23, and a fourth layer are stacked from the transparent substrate 1 side. The preferable refractive indexes, extinction coefficients, and film thicknesses of the first layer 21, the second layer 22, and the third layer 23 are as mentioned in the first and second embodiments, and their explanations are omitted. The configurations of the transparent substrate 1, the light shielding film 3, and the hard mask film 4 are as mentioned in the first embodiment.

The fourth layer 24 is preferably formed from a material including silicon and oxygen, or a material including silicon, oxygen, and one or more elements selected from metalloid elements and non-metallic elements.

Further, a refractive index $n_1$ of the first layer 21, a refractive index $n_2$ of the second layer 22, a refractive index $n_3$ of the third layer 23, and a refractive index $n_4$ of the fourth layer 24 preferably simultaneously satisfy relations of $n_3<n_1<n_2$ and $n_4<n_1<n_2$. Further, an extinction coefficient $k_1$ of the first layer 21, an extinction coefficient $k_2$ of the second layer 22, an extinction coefficient $k_3$ of the third layer 23, and an extinction coefficient $k_4$ of the fourth layer 24 preferably simultaneously satisfy relations of $k_1<k_2<k_3$ and $k_4<k_1<k_2$. In addition, a refractive index $n_4$ of the fourth layer 24 is preferably 1.7 or less, and more preferably 1.65 or less. Further, a refractive index $n_4$ of the fourth layer 24 is preferably 1.50 or more, and more preferably 1.52 or more. Further, an extinction coefficient $k_4$ of the fourth layer 24 is preferably 0.02 or less, and more preferably 0.01 or less. Further, an extinction coefficient $k_4$ of the fourth layer 24 is preferably 0.00 or more.

The thickness of the fourth layer 24 is preferably 10 nm or less, and more preferably 9 nm or less. Further, the thickness of the fourth layer 24 is preferably 2 nm or more, and more preferably 3 nm or more.

An oxygen content of the fourth layer 24 is preferably greater than an oxygen content of the first layer 21. An oxygen content of the fourth layer 24 is preferably 50 atom % or more, and more preferably 55 atom % or less.

By the above configuration, the mask blank 120 of this embodiment can generate substantially 180 degrees phase difference, can prevent generation of haze that is likely to generate in a silicon-containing film with a large amount of nitrogen content, and further reduction of a back surface reflectance is possible compared to the mask blank 100 of the first embodiment.

FIG. 4 is a cross-sectional view showing a configuration of a mask blank 130 of the fourth embodiment of this disclosure. The mask blank 130 of this embodiment has a structure where a first layer 21, a second layer 22, and a third A layer 25 are stacked from the transparent substrate 1 side. The preferable refractive indexes, extinction coefficients, and film thicknesses of the first layer 21 and the second layer 22 are as mentioned in the first embodiment, and their explanations are omitted. The configurations of the transparent substrate 1, the light shielding film 3, and the hard mask film 4 are as mentioned in the first embodiment.

The third A layer 25 is preferably formed from a material including silicon and oxygen, or a material including silicon, oxygen, and one or more elements selected from metalloid elements and non-metallic elements.

A refractive index $n_1$ of the first layer 21, a refractive index $n_2$ of the second layer 22, and a refractive index $n_{3A}$ of the third A layer 25 preferably satisfy a relation of $n_{3A}<n_1<n_2$. Further, an extinction coefficient $k_1$ of the first layer 21, an extinction coefficient $k_2$ of the second layer 22, and an extinction coefficient $k_{3A}$ of the third A layer 25 preferably satisfy a relation of $k_{3A}<k_1<k_2$. In addition, a refractive index $n_{3A}$ of the third A layer 25 is preferably 1.7 or less, and more preferably 1.65 or less. Further, a refractive index $n_{3A}$ of the third A layer 25 is preferably 1.50 or more, and more preferably 1.52 or more. Further, an extinction coefficient $k_{3A}$ of the third A layer 25 is preferably 0.02 or less, and more preferably 0.01 or less. Further, an extinction coefficient $k_{3A}$ of the third A layer 25 is preferably 0.00 or more.

A film thickness $d_1$ of the first layer 21, a film thickness $d_2$ of the second layer 22, and a film thickness $d_{3A}$ of the third A layer 25 preferably satisfy a relation of $d_{3A}<d_1<d_2$. In addition to the above, a film thickness $d_{3A}$ of the third A layer 25 is preferably 30 nm or less, and more preferably 25 nm or less. Further, a film thickness $d_{3A}$ of the third A layer 25 is preferably 2 nm or more, and more preferably 3 nm or more.

An oxygen content of the third A layer 25 is preferably greater than an oxygen content of the first layer 21. Further, an oxygen content of the third A layer 25 is preferably 50 atom % or more, and more preferably 55 atom % or less.

By the above configuration, the mask blank 130 of this embodiment can generate substantially 180 degrees phase difference, and further reduction of a back surface reflectance is possible compared to the mask blank 100 of the first embodiment.

FIGS. 5A-5G show phase shift masks 200, 210, 220, 230 according to the first to fourth embodiments of this disclosure manufactured from the mask blanks 100, 110, 120, 130 of the first to fourth embodiments, and their manufacturing process.

Figure 5B:
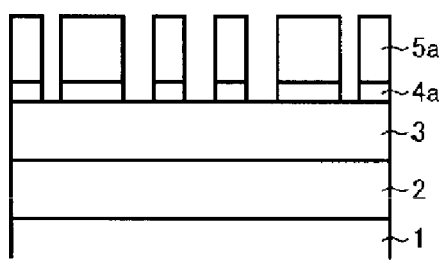
Figure 5F:
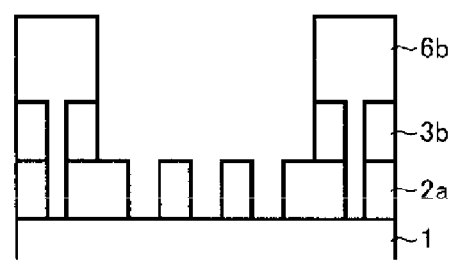
Figure 5C:
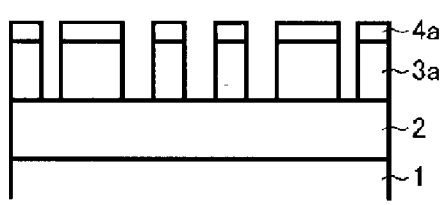
Figure 5G:
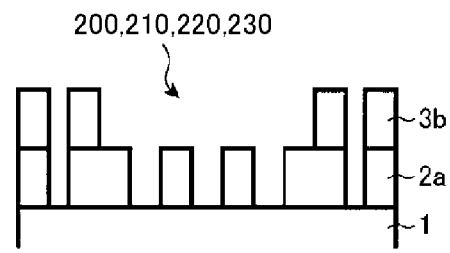
Figure 5D:
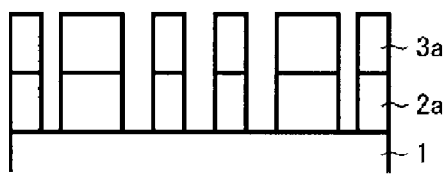

As shown in FIG. 5G, the phase shift mask 200, 210, 220, 230 is featured in that a phase shift pattern 2a as a transfer pattern is formed in a phase shift film 2 of the mask blank 100, 110, 120, 130, and a light shielding pattern 3b is formed in a light shielding film 3. In the case of a configuration where a hard mask film 4 is provided on the mask blank 100, 110, 120, 130, the hard mask film 4 is removed during manufacture of the phase shift mask 200, 210, 220, 230.

The method of manufacturing the phase shift masks 200, 210, 220, 230 of the first to fourth embodiments of this disclosure uses the mask blanks 100, 110, 120, 130 mentioned above, which is featured in including the steps of forming a transfer pattern in the light shielding film 3 by dry etching; forming a transfer pattern in the phase shift film 2 by dry etching with the light shielding film 3 including the transfer pattern as a mask; and forming a light shielding pattern 3b in the light shielding film 3 by dry etching with a resist film (second resist pattern 6b) including a light shielding pattern as a mask. The method for manufacturing the phase shift mask 200, 210, 220, 230 of this disclosure is explained below according to the manufacturing steps shown in FIGS. 5A-5G. Explained herein is the method of manufacturing the phase shift mask 200, 210, 220, 230 using a mask blank 100, 110, 120, 130 having a hard mask film 4 stacked on a light shielding film 3. Further, a material containing chromium is applied to the light shielding film 3, and a material containing silicon is applied to the hard mask film 4 in this case.

First, a resist film is formed in contact with the hard mask film 4 of the mask blank 100, 110, 120, 130 by spin coating. Next, a first pattern, which is a transfer pattern (phase shift pattern) to be formed in the phase shift film 2, was exposed and written with an electron beam in the resist film, and a predetermined treatment such as developing was conducted, to thereby form a first resist pattern 5a having a phase shift pattern (see FIG. 5A). Subsequently, dry etching was conducted using fluorine-based gas with the first resist pattern 5a as a mask, and a first pattern (hard mask pattern 4a) was formed in the hard mask film 4 (see FIG. 5B).

Next, after removing the resist pattern 5a, dry etching was conducted using mixed gas of chlorine-based gas and oxygen gas with the hard mask pattern 4a as a mask, and a first pattern (light shielding pattern 3a) was formed in the light shielding film 3 (see FIG. 5C). Subsequently, dry etching was conducted using fluorine-based gas with the light shielding pattern 3a as a mask, and a first pattern (phase shift pattern 2a) was formed in the phase shift film 2, and at the same time, the hard mask pattern 4a was removed (see FIG. 5D).

Next, a resist film was formed on the mask blank 100, 110, 120, 130 by spin coating. Next, a second pattern, which is a pattern (light shielding pattern) to be formed in the light shielding film 3, was exposed and written with an electron beam on the resist film, and a predetermined treatment such as developing was conducted, to thereby form a second resist pattern 6b having a light shielding pattern (see FIG. 5E). Subsequently, dry etching was conducted using mixed gas of chlorine-based gas and oxygen gas with the second resist pattern 6b as a mask, and a second pattern (light shielding pattern 3b) was formed in the light shielding film 3 (see FIG. 5F). Further, the second resist pattern 6b was removed, predetermined treatments such as cleaning were carried out, and the phase shift mask 200, 210, 220, 230 was obtained (see FIG. 5G).

There is no particular limitation on chlorine-based gas to be used for the dry etching described above, as long as Cl is included. The chlorine-based gas includes, for example, $Cl_2$, $SiCl_2$, $CHCl_3$, $CH_2Cl_2$, $CCl_4$, and $BCl_3$. Further, there is no particular limitation on fluorine-based gas to be used for the dry etching described above, as long as F is included. The fluorine-based gas includes, for example, $CHF_3$, $CF_4$, $C_2F_6$, $C_4F_8$, and $SF_6$. Particularly, fluorine-based gas free of C can further reduce damage on a glass substrate for having a relatively low etching rate to a glass substrate.

The phase shift mask 200, 210, 220, 230 of this disclosure is manufactured using the mask blank 100, 110, 120, 130 mentioned above. Therefore, the phase shift film 2 having a transfer pattern formed therein (phase shift pattern 2a) has a transmittance of 15% or more to an exposure light of an ArF excimer laser, and a phase difference between an exposure light transmitted through the phase shift pattern 2a and the exposure light that transmitted through the air for the same distance as the thickness of the phase shift pattern 2a of within the range of 150 degrees or more and 200 degrees or less. This phase shift mask 200 has 9% or less back surface reflectance in a region of the phase shift pattern 2a where the light shielding pattern 3b is not stacked (region on transparent substrate 1 where only phase shift pattern 2a exists). This can prevent an influence on an exposure transfer image by the stray light when the phase shift mask 200 was used to exposure-transfer an object to be transferred (resist film on semiconductor wafer, etc.).

The method of manufacturing the semiconductor device of this disclosure is featured in using the phase shift mask 200, 210, 220, 230 given above and subjecting a resist film on a semiconductor substrate to exposure transfer of a transfer pattern. The phase shift mask 200, 210, 220, 230 has both of a function to transmit an exposure light of an ArF excimer laser at a predetermined transmittance and a function to generate a predetermined phase difference to the transmitting exposure light of an ArF excimer laser, and has a back surface reflectance of 9% or less, which is significantly lower than conventional cases. Therefore, even if the phase shift mask 200, 210, 220, 230 was set on an exposure apparatus, and irradiated with an exposure light of an ArF excimer laser from the transparent substrate 1 side of the phase shift mask 200, 210, 220, 230 and exposure-transferred to an object to be transferred (resist film on semiconductor wafer etc.), projection of bar codes and alignment marks formed on the phase shift mask 200, 210, 220, 230 can be suppressed, and a desired pattern can be transferred to the object to be transferred at a high precision.

On the other hand, it is possible to achieve a phase shift film having both of a predetermined transmittance and a predetermined phase difference to an exposure light of an ArF excimer laser, and also a back surface reflectance of 9% or less in a configuration of a phase shift film of an alternative disclosure that differs from the configuration of the phase shift film shown in each of the first to fourth embodiments of this disclosure given above. For example, a mask blank of the alternative disclosure includes a phase shift film on a transparent substrate, the phase shift film having a structure where a first B layer, a second B layer, a third B layer, and a fourth B layer stacked in this order from the side of the transparent substrate, the first B layer is provided in contact with a surface of the transparent substrate, refractive indexes $n_{1B}$, $n_{2B}$, $n_{3B}$, $n_{4B}$ of the first B layer, the second B layer, the third B layer, and the fourth B layer, respectively, to a wavelength of an exposure light of an ArF excimer laser simultaneously satisfy relations of $n_{4B}<n_{1B}<n_{2B}$ and $n_{4B}<n_{3B}<n_{2B}$, extinction coefficients $k_{1B}$, $k_{2B}$, $k_{3B}$, $k_{4B}$ of the first B layer, the second B layer, the third B layer, and the fourth B layer, respectively, to a wavelength of an exposure light simultaneously satisfy relations of $k_{4B}<k_{1B}<k_{2B}$ and $k_{4B}<k_{3B}<k_{2B}$, and film thicknesses $d_{1B}$, $d_{2B}$, $d_{3B}$, $d_{4B}$ of the first B layer, the second B layer, the third B layer, and the fourth B layer, respectively, simultaneously satisfy relations of $d_{1B}>d_{3B}>d_{4B}$ and $d_{2B}>d_{3B}>d_{4B}$. Incidentally, the configurations of the transparent substrate, the light shielding film, and the hard mask film are as mentioned in the first embodiment. Further, the matters on the phase shift film are similar to those described in the first embodiment, other than those described below.

The first B layer and the third B layer are preferably formed from a material including silicon, nitrogen, and oxygen, or a material including silicon, nitrogen, oxygen, and one or more elements selected from metalloid elements and non-metallic elements. Further, the second B layer is preferably formed from a material including silicon and nitrogen, or a material formed from silicon, nitrogen, and one or more elements selected from metalloid elements and non-metallic elements. The fourth B layer is preferably formed from a material including silicon and oxygen, or a material including silicon, oxygen, and one or more elements selected from metalloid elements and non-metallic elements.

A refractive index $n_{1B}$ of the first B layer is preferably 1.8 or more, and more preferably 1.85 or more. Further, a refractive index $n_{1B}$ of the first B layer is preferably less than 2.2, and more preferably 2.15 or less. An extinction coefficient $k_{1B}$ of the first B layer is preferably 0.15 or less, and more preferably 0.14 or less. Further, an extinction coefficient $k_{1B}$ of the first B layer is preferably 0.05 or more, and more preferably 0.06 or more. A film thickness $d_{1B}$ of the first B layer is preferably 35 nm or less, and more preferably 33 nm or less. Further, a film thickness $d_{1B}$ of the first B layer is preferably more than 20 nm, and more preferably 21 nm or more.

A refractive index $n_{2B}$ of the second B layer is preferably 2.2 or more, and more preferably 2.25 or more. Further, a refractive index $n_{2B}$ of the second B layer is preferably 3.0 or less, and more preferably 2.8 or less. Further, an extinction coefficient $k_{2B}$ of the second B layer is preferably 0.2 or more, and more preferably 0.25 or more. Further, an extinction coefficient $k_{2B}$ of the second B layer is preferably 0.5 or less, and more preferably 0.4 or less. A film thickness $d_{2B}$ of the second B layer is preferably 35 nm or less, and more preferably 33 nm or less. Further, a film thickness $d_{2B}$ of the second B layer is preferably greater than 20 nm, and more preferably 21 nm or more.

A refractive index $n_{3B}$ of the third B layer is preferably 1.8 or more, and more preferably 1.85 or more. Further, a refractive index $n_{3B}$ of the third B layer is preferably less than 2.2, and more preferably 2.15 or less. An extinction coefficient $k_{3B}$ of the third B layer is preferably 0.15 or less, and more preferably 0.14 or less. Further, an extinction coefficient $k_{3B}$ of the third B layer is preferably 0.05 or more, and more preferably 0.06 or more. A film thickness $d_{3B}$ of the third B layer is preferably 20 nm or less, and more preferably 19 nm or less. Further, a film thickness $d_{3B}$ of the third B layer is preferably 10 nm or more, and more preferably 15 nm or more.

A refractive index $n_{4B}$ of the fourth B layer is preferably 1.7 or less, and more preferably 1.65 or less. Further, a refractive index $n_{4B}$ of the fourth B layer is preferably 1.50 or more, and more preferably 1.52 or more. Further, an extinction coefficient $k_{4B}$ of the fourth B layer is preferably 0.1 or less, and more preferably 0.01 or less. Further, an extinction coefficient $k_{4B}$ of the fourth B layer is preferably 0.00 or more. A film thickness $d_{4B}$ of the fourth B layer is preferably less than 10 nm, and more preferably 9 nm or less. Further, a film thickness $d_{4B}$ of the fourth B layer is preferably 2 nm or more, and more preferably 3 nm or more.

It is preferable that a nitrogen content of the second B layer is greater than a nitrogen content of the first B layer and the third B layer. A nitrogen content of the first B layer and the third B layer is preferably 40 atom % or less, and more preferably 30 atom % or less. Further, a nitrogen content of the first B layer and the third B layer is preferably 10 atom % or more, and more preferably 15 atom % or more. On the other hand, a nitrogen content of the second B layer is preferably 45 atom % or more, more preferably 50 atom % or more, and even more preferably 55 atom % or more. This is because, while the second B layer is preferably formed from a material having a high refractive index, increasing a nitrogen content can increase a refractive index.

It is preferable that an oxygen content of the first B layer and the third B layer is greater than an oxygen content of the second B layer. An oxygen content of the first B layer and the third B layer is preferably 10 atom % or more, and more preferably 15 atom % or more. Further, an oxygen content of the first B layer and the third B layer is preferably 45 atom % or less, and more preferably 40 atom % or less. On the other hand, an oxygen content of the second B layer is preferably 45 atom % or less, and more preferably 2 atom % or less. It is further preferable that the second B layer is free of oxygen. This is because as an oxygen content in the second B layer increases, a refractive index of the second B layer decreases.

It is preferable that an oxygen content of the fourth B layer is greater than an oxygen content of the first B layer, the second B layer, and the third B layer. An oxygen content of the fourth B layer is preferably 50 atom % or more, and more preferably 55 atom % or less.

On the other hand, a phase shift mask can be manufactured from the mask blank of the alternative disclosure through the same procedure as manufacturing the phase shift mask from the mask blank of the first to fourth embodiments. The phase shift mask of the alternative disclosure is featured in that a phase shift pattern as a transfer pattern is formed in the phase shift film of the mask blank of the alternative disclosure, and a light shielding pattern is formed in the light shielding film.

On the other hand, it is possible to use the phase shift mask of the alternative disclosure in the method of manufacturing the semiconductor device of this disclosure. The phase shift mask of the alternative disclosure has both of a function to transmit an exposure light of an ArF excimer laser at a predetermined transmittance and a function to generate a predetermined phase difference to the transmitting exposure light of an ArF excimer laser, and has a back surface reflectance of 9% or less, which is significantly lower than conventional cases. Therefore, even if the phase shift mask of the alternative disclosure was set on an exposure apparatus, and irradiated with an exposure light of an ArF excimer laser from the transparent substrate side of the phase shift mask of the alternative disclosure and exposure-transferred to an object to be transferred (resist film on semiconductor wafer etc.), projection of bar codes and alignment marks formed on the phase shift mask of the alternative disclosure can be suppressed, and a desired pattern can be transferred to the object to be transferred at a high precision.

EXAMPLE 1

The embodiments of this disclosure are described in greater details below together with examples.

EXAMPLE 1

[Manufacture of Mask Blank]

A transparent substrate 1 of a synthetic quartz glass with a size of a main surface of about 152 mm× about 152 mm and a thickness of about 6.35 mm was prepared. End surfaces and the main surface of the transparent substrate 1 were polished to a predetermined surface roughness, and thereafter subjected to predetermined cleaning treatment and drying treatment. The optical properties of the transparent substrate 1 were measured, and a refractive index $n_S$ was 1.556 and an extinction coefficient $k_S$ was 0.00.

Next, a first layer 21 of a phase shift film 2 including silicon, oxygen, and nitrogen (SiON film Si:O:N=40 atom %:35 atom %:25 atom %) was formed in contact with a surface of the transparent substrate 1 at a thickness of 29.5 nm. The first layer 21 was formed by placing the transparent substrate 1 in a single-wafer RF sputtering apparatus, and by RF sputtering using a silicon (Si) target, using mixed gas of argon (Ar), oxygen ($O_2$), and nitrogen ($N_2$) as sputtering gas. Next, a second layer 22 of the phase shift film 2 including silicon and nitrogen (SiN film Si:N=43 atom %:57 atom %) was formed on the first layer 21 at a thickness of 41.5 nm. The second layer 22 was formed by reactive sputtering (RF sputtering) using a silicon (Si) target with mixed gas of argon (Ar) and nitrogen ($N_2$) as sputtering gas. By the above procedure, the phase shift film 2 having the first layer 21 and the second layer 22 stacked in contact with the surface of the transparent substrate 1 was formed at a thickness of 71 nm. The composition of the first layer 21 and the second layer 22 is the result obtained from measurement by X-ray photoelectron spectroscopy (XPS). The same applies to other films hereafter.

Next, a transmittance and a phase difference of the phase shift film 2 to a light of 193 nm wavelength were measured using a phase shift measurement apparatus (MPM193 manufactured by Lasertec), and a transmittance was 27.4% and a phase difference was 183.2 degrees. Moreover, each optical property was measured for the first layer 21 and the second layer 22 of the phase shift film 2 using a spectroscopic ellipsometer (M-2000D manufactured by J. A. Woollam), and the first layer 21 had a refractive index $n_1$ of 1.990 and an extinction coefficient $k_1$ of 0.085; and the second layer 22 had a refractive index $n_2$ of 2.595 and an extinction coefficient $k_2$ of 0.357. A back surface reflectance of the phase shift film 2 to a light of a wavelength of an exposure light of an ArF excimer laser was 3.7%, which was below 9%.

Next, a light shielding film 3 including CrOCN (CrOCN film Cr:O:C:N=55 atom %:22 atom %:12 atom %:11 atom %) was formed on the phase shift film 2 at a thickness of 59.5 nm. The light shielding film 3 was formed by placing a transparent substrate 1 having a phase shift film 2 formed thereon in a single-wafer DC sputtering apparatus, and by reactive sputtering (DC sputtering) using a chromium (Cr) target with mixed gas of argon (Ar), carbon dioxide ($CO_2$), nitrogen ($N_2$), and helium (He) as sputtering gas. A back surface reflectance in the stacked condition of the phase shift film 2 and the light shielding film 3 on the transparent substrate 1 to a light of a wavelength of an exposure light of an ArF excimer laser was 0.5%, which was below 9%. The optical density (OD) to a light of 193 nm wavelength in the stacked structure of the phase shift film 2 and the light shielding film 3 was 3.0 or more. Further, another transparent substrate 1 was prepared, only a light shielding film 3 was formed under the same film-forming conditions, the optical properties of the light shielding film 3 were measured using the spectroscopic ellipsometer, and a refractive index n was 1.92 and an extinction coefficient k was 1.50.

Next, a hard mask film 4 including silicon and oxygen was formed on the light shielding film 3 at a thickness of 5 nm. The hard mask film 4 was formed by placing the transparent substrate 1 having the phase shift film 2 and the light shielding film 3 stacked thereon in a single-wafer RF sputtering apparatus, and by RF sputtering using a silicon dioxide ($SiO_2$) target with argon (Ar) gas as sputtering gas. Through the above procedure, the mask blank 100 was formed, having a structure where the three layer structure phase shift film 2, the light shielding film 3, and the hard mask film 4 are stacked on the transparent substrate 1.

[Manufacture of Phase Shift Mask]

Next, a phase shift mask 200 of Example 1 was manufactured through the following procedure using the mask blank 100 of Example 1. First, a surface of the hard mask film 4 was subjected to HMDS treatment. Subsequently, a resist film of a chemically amplified resist for electron beam writing was formed in contact with a surface of the hard mask film 4 by spin coating at a film thickness of 80 nm. Next, a first pattern, which is a phase shift pattern to be formed in the phase shift film 2, was written on the resist film by an electron beam. Further, predetermined cleaning and developing treatments were conducted, and a first resist pattern 5a having the first pattern was formed (see FIG. 5A). At this stage, a pattern of a shape corresponding to bar codes and alignment marks was formed on the first resist pattern 5a outside of a pattern forming region.

Next, dry etching using $CF_4$ gas was conducted with the first resist pattern 5a as a mask, and a first pattern (hard mask pattern 4a) was formed in the hard mask film 4 (see FIG. 5B). At this stage, a pattern of a shape corresponding to bar codes and alignment marks was also formed on the hard mask film 4 outside of a pattern forming region. Thereafter the first resist pattern 5a was removed.

Subsequently, dry etching was conducted using mixed gas of chlorine and oxygen (gas flow ratio $Cl_2:O_2$=10:1) with the hard mask pattern 4a as a mask, and a first pattern (light shielding pattern 3a) was formed in the light shielding film 3 (see FIG. 5C). At this stage, a pattern of a shape corresponding to bar codes and alignment marks was also formed on the light shielding film 3 outside of a pattern forming region. Next, dry etching was conducted using fluorine-based gas ($SF_6$+He) with the light shielding pattern 3a as a mask, and a first pattern (phase shift pattern 2a) was formed in the phase shift film 2, and at the same time the hard mask pattern 4a was removed (see FIG. 5D). At this stage, a pattern of a shape corresponding to bar codes and alignment marks was also formed on the phase shift film 2 outside of a pattern forming region.

Next, a resist film of a chemically amplified resist for electron beam writing was formed on the light shielding pattern 3a by spin coating at a film thickness of 150 nm. Next, a second pattern, which is a pattern (light shielding pattern) to be formed in the light shielding film, was exposed and written in the resist film, further subjected to predetermined treatments such as developing, and a second resist pattern 6b having the light shielding pattern was formed (see FIG. 5E). Subsequently, dry etching was conducted using mixed gas of chlorine and oxygen (gas flow ratio $Cl_2:O_2$=4:1) with the second resist pattern 6b as a mask, and a second pattern (light shielding pattern 3b) was formed in the light shielding film 3 (FIG. 5F). Further, the second resist pattern 6b was removed, predetermined treatments such as cleaning were carried out, and the phase shift mask 200 was obtained (see FIG. 5G).

Regarding the phase shift mask 200, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask 200 manufactured from the mask blank of Example 1 was set on an exposure apparatus and subjected to exposure transfer by an exposure light of an ArF excimer laser.

EXAMPLE 2

[Manufacture of Mask Blank]

A mask blank 110 of Example 2 was manufactured through the same procedure as Example 1, except for the phase shift film 2. In the phase shift film 2 of Example 2, a third layer 23 is formed on a second layer 22. Concretely, a first layer 21 of the phase shift film 2 including silicon, oxygen, and nitrogen (SiON film Si:O:N=40 atom %:35 atom %:25 atom %) was formed in contact with a surface of the transparent substrate 1 at a thickness of 29.5 nm. The phase shift film 2 was formed by placing the transparent substrate 1 in a single-wafer RF sputtering apparatus, and by RF sputtering using a silicon (Si) target, using mixed gas of argon (Ar), oxygen ($O_2$), and nitrogen ($N_2$) as sputtering gas. Next, a second layer 22 of the phase shift film 2 including silicon and nitrogen (SiN film Si:N=43 atom %:57 atom %) was formed on the first layer 21 at a thickness of 41.5 nm. The second layer 22 was formed by reactive sputtering (RF sputtering) using a silicon (Si) target with mixed gas of argon (Ar) and nitrogen ($N_2$) as a sputtering gas. Next, a third layer 23 of the phase shift film 2 including silicon and nitrogen (SiN film Si:N=68 atom %:32 atom %) was formed on the second layer 22 at a thickness of 3 nm. The third layer 23 was formed by reactive sputtering (RF sputtering) using a silicon (Si) target, with mixed gas of argon (Ar) and nitrogen ($N_2$) as sputtering gas. By the above procedure, the phase shift film 2 having the first layer 21, the second layer 22, and the third layer 23 stacked in contact with the surface of the transparent substrate 1 was formed at a thickness of 74 nm.

A transmittance and a phase difference of the phase shift film 2 to a light of a wavelength (193 nm wavelength) of an exposure light of an ArF excimer laser were measured using the phase shift measurement apparatus, and a transmittance was 19.6% and a phase difference was 175.8 degrees. Moreover, each optical property was measured for the first layer 21, the second layer 22, and the third layer 23 of the phase shift film 2 using the spectroscopic ellipsometer, and the first layer 21 had a refractive index $n_1$ of 1.990 and an extinction coefficient $k_1$ of 0.085; the second layer 22 had a refractive index $n_2$ of 2.595 and an extinction coefficient $k_2$ of 0.357; and the third layer 23 had a refractive index $n_3$ of 1.648 and an extinction coefficient $k_3$ of 1.861. A back surface reflectance (reflectance at transparent substrate 1 side) of the phase shift film 2 to a light of a wavelength of an exposure light of an ArF excimer laser was 6.3%, which was below 9%.

Through the above procedure, the mask blank 110 of Example 2 was manufactured, the mask blank 110 having a structure in which the phase shift film 2 including the first layer 21, the second layer 22, and the third layer 23; the light shielding film 3; and the hard mask film 4 are stacked on the transparent substrate 1. In the mask blank 110 of Example 2, a back surface reflectance (reflectance at transparent substrate 1 side) to a light of a wavelength of an exposure light of an ArF excimer laser with the phase shift film 2 and the light shielding film 3 stacked on the transparent substrate 1 was 6.9%, which was below 9%. The optical density (OD) to a light of 193 nm wavelength in the stacked structure of the phase shift film 2 and the light shielding film 3 was 3.0 or more.

[Manufacture of Phase Shift Mask]

Next, a phase shift mask 210 of Example 2 was manufactured through the same procedure as Example 1 using the mask blank 110 of Example 2.

Regarding the phase shift mask 210, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask 210 manufactured from the mask blank of Example 2 was set on an exposure apparatus and subjected to exposure transfer by an exposure light of an ArF excimer laser.

EXAMPLE 3

[Manufacture of Mask Blank]

A mask blank 120 of Example 3 was manufactured through the same procedure as Example 1, except for the phase shift film 2. In the phase shift film 2 of Example 3, a fourth layer 24 is formed on a third layer 23. Concretely, a first layer 21 of the phase shift film 2 including silicon, oxygen, and nitrogen (SiON film Si:O:N=40 atom %:35 atom %:25 atom %) was formed in contact with a surface of the transparent substrate 1 at a thickness of 29.5 nm. The first layer 21 was formed by placing the transparent substrate 1 in a single-wafer RF sputtering apparatus, and by RF sputtering using a silicon (Si) target, using mixed gas of argon (Ar), oxygen ($O_2$), and nitrogen ($N_2$) as sputtering gas. Next, a second layer 22 of the phase shift film 2 including silicon and nitrogen (SiN film Si:N=43 atom %:57 atom %) was formed on the first layer 21 at a thickness of 41.5 nm. The second layer 22 was formed by reactive sputtering (RF sputtering) using a silicon (Si) target with mixed gas of argon (Ar) and nitrogen ($N_2$) as sputtering gas. Next, a third layer 23 of the phase shift film 2 including silicon and nitrogen (Si:N=68 atom %:32 atom %) was formed on the second layer 22 at a thickness of 3 nm. The third layer 23 was formed by reactive sputtering (RF sputtering) using a silicon (Si) target, with mixed gas of argon (Ar) and nitrogen ($N_2$) as sputtering gas. Subsequently, a fourth layer 24 of the phase shift film 2 including silicon and oxygen (SiO film Si:O=33 atom %:67 atom %) was formed on the third layer 23 at a thickness of 3 nm. The fourth layer 24 was formed by reactive sputtering (RF sputtering) using a silicon (Si) target with mixed gas of argon (Ar) and oxygen ($O_2$) as sputtering gas. By the above procedure, the phase shift film 2 having the first layer 21, the second layer 22, the third layer 23, and the fourth layer 24 stacked in contact with the surface of the transparent substrate 1 was formed at a thickness of 77 nm.

A transmittance and a phase difference of the phase shift film 2 to a light of a wavelength (193 nm wavelength) of an exposure light of an ArF excimer laser were measured using the phase shift measurement apparatus, and a transmittance was 20.1% and a phase difference was 178.0 degrees. Further, each optical property was measured for the first layer 21, the second layer 22, the third layer 23, and the fourth layer 24 of the phase shift film 2 using the spectroscopic ellipsometer, and the first layer 21 had a refractive index $n_1$ of 1.990 and an extinction coefficient $k_1$ of 0.085; the second layer 22 had a refractive index $n_2$ of 2.595 and an extinction coefficient $k_2$ of 0.357; the third layer 23 had a refractive index $n_3$ of 1.648 and an extinction coefficient $k_3$ of 1.861; and the fourth layer 24 had a refractive index $n_4$ of 1.590 and an extinction coefficient $k_4$ of 0.000. A back surface reflectance (reflectance at transparent substrate 1 side) of the phase shift film 2 to a light of a wavelength of an exposure light of an ArF excimer laser was 5.8%, which was below 9%.

Through the above procedure, the mask blank 120 of Example 3 was manufactured, the mask blank 120 having a structure in which the phase shift film 2 including the first layer 21, the second layer 22, the third layer 23, and the fourth layer 24; the light shielding film 3; and the hard mask film 4 are stacked on the transparent substrate 1. In the mask blank 120 of Example 3, back surface reflectance (reflectance at transparent substrate 1 side) to light of 193 nm wavelength with the phase shift film 2 and the light shielding film 3 stacked on the transparent substrate 1 was 7.7%, which was below 9%. The optical density (OD) to a light of 193 nm wavelength in the stacked structure of the phase shift film 2 and the light shielding film 3 was 3.0 or more.

[Manufacture of Phase Shift Mask]

Next, a phase shift mask 220 of Example 3 was manufactured through the same procedure as Example 1 using the mask blank 120 of Example 3.

Regarding the phase shift mask 220, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask 220 manufactured from the mask blank of Example 3 was set on an exposure apparatus and subjected to exposure transfer by an exposure light of an ArF excimer laser.

EXAMPLE 4

[Manufacture of Mask Blank]

A mask blank 130 of Example 4 was manufactured through the same procedure as Example 1, except for the phase shift film 2. In the phase shift film 2 of Example 4, a third A layer 25 having a different composition than the third layer 23 is formed on the second layer 22. Concretely, a first layer 21 of the phase shift film 2 including silicon, oxygen, and nitrogen (SiON film Si:O:N=40 atom %:35 atom %:25 atom %) was formed in contact with a surface of the transparent substrate 1 at a thickness of 29.5 nm. The first layer 21 was formed by placing the transparent substrate 1 in a single-wafer RF sputtering apparatus, and by RF sputtering using a silicon (Si) target, using mixed gas of argon (Ar), oxygen ($O_2$), and nitrogen ($N_2$) as sputtering gas. Next, a second layer 22 of the phase shift film 2 including silicon and nitrogen (SiN film Si:N=43 atom %:57 atom %) was formed on the first layer 21 at a thickness of 41.5 nm. The second layer 22 was formed by reactive sputtering (RF sputtering) using a silicon (Si) target with mixed gas of argon (Ar) and nitrogen ($N_2$) as sputtering gas. Subsequently, a third A layer 25 of the phase shift film 2 including silicon and oxygen (SiO film Si:O=33 atom %:67 atom %) was formed on the second layer 22 at a thickness of 3 nm. The third A layer 25 was formed by reactive sputtering (RF sputtering) using a silicon (Si) target with mixed gas of argon (Ar) and oxygen ($O_2$) as sputtering gas. Through the above procedure, the phase shift film 2 having the first layer 21, the second layer 22, and the third A layer 25 stacked in contact with the surface of the transparent substrate 1 was formed at a thickness of 74 nm.

A transmittance and a phase difference of the phase shift film 2 to a light of a wavelength (193 nm wavelength) of an exposure light of an ArF excimer laser were measured using the phase shift measurement apparatus, and a transmittance was 27.7% and a phase difference was 179.3 degrees. Moreover, each optical property was measured for the first layer 21, the second layer 22, and the third A layer 25 of the phase shift film 2 using the spectroscopic ellipsometer, and the first layer 21 had a refractive index $n_1$ of 1.990 and an extinction coefficient $k_1$ of 0.085; the second layer 22 had a refractive index $n_2$ of 2.595 and an extinction coefficient $k_2$ of 0.357; and the third A layer 25 had a refractive index $n_3$ of 1.590 and an extinction coefficient $k_{3A}$ of 0.000. A back surface reflectance (reflectance at transparent substrate 1 side) of the phase shift film 2 to a light of a wavelength of an exposure light of an ArF excimer laser was 8.4%, which was below 9%.

Through the above procedure, the mask blank 130 of Example 4 was manufactured, the mask blank 130 having a structure in which the phase shift film 2 including the first layer 21, the second layer 22, and the third A layer 25; the light shielding film 3; and the hard mask film 4 are stacked on the transparent substrate 1. In the mask blank 130 of Example 4, a back surface reflectance (reflectance at transparent substrate 1 side) to a light of a wavelength of an exposure light of an ArF excimer laser with the phase shift film 2 and the light shielding film 3 stacked on the transparent substrate 1 was 8.3%, which was below 9%. The optical density (OD) to a light of 193 nm wavelength in the stacked structure of the phase shift film 2 and the light shielding film 3 was 3.0 or more.

[Manufacture of Phase Shift Mask]

Next, a phase shift mask 230 of Example 4 was manufactured through the same procedure as Example 1 using the mask blank 130 of Example 4.

Regarding the phase shift mask 230, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask 230 manufactured from the mask blank of Example 4 was set on an exposure apparatus and subjected to exposure transfer by an exposure light of an ArF excimer laser.

EXAMPLE 5

[Manufacture of Mask Blank]

A mask blank 130 of Example 5 was manufactured through the same procedure as Example 1, except for the phase shift film 2. The change in the phase shift film 2 of Example 5 compared to Example 4 is the film thickness of each of the first layer 21, the second layer 22, and the third A layer 25. Concretely, a first layer 21 of the phase shift film 2 including silicon, oxygen, and nitrogen (SiON film Si:O:N=40 atom %:35 atom %:25 atom %) was formed in contact with a surface of the transparent substrate 1 at a thickness of 31 nm. The first layer 21 was formed by placing the transparent substrate 1 in a single-wafer RF sputtering apparatus, and by RF sputtering using a silicon (Si) target, using mixed gas of argon (Ar), oxygen ($O_2$), and nitrogen ($N_2$) as sputtering gas. Next, a second layer 22 of the phase shift film 2 including silicon and nitrogen (SiN film Si:N=43 atom %:57 atom %) was formed on the first layer 21 at a thickness of 38 nm. The second layer 22 was formed by reactive sputtering (RF sputtering) using a silicon (Si) target with mixed gas of argon (Ar) and nitrogen ($N_2$) as sputtering gas. Subsequently, a third A layer 25 of the phase shift film 2 including silicon and oxygen (SiO film Si:O=33 atom %:67 atom %) was formed on the second layer 22 at a thickness of 20 nm. The third A layer 25 was formed by reactive sputtering (RF sputtering) using a silicon (Si) target with mixed gas of argon (Ar) and oxygen ($O_2$) as sputtering gas. By the above procedure, the phase shift film 2 having the first layer 21, the second layer 22, and the third A layer 25 stacked in contact with the surface of the transparent substrate 1 was formed at a thickness of 89 nm.

A transmittance and a phase difference of the phase shift film 2 to a light of a wavelength (193 nm wavelength) of an exposure light of an ArF excimer laser were measured using the phase shift measurement apparatus, and a transmittance was 35.2% and a phase difference was 189.6 degrees. Moreover, each optical property was measured for the first layer 21, the second layer 22, and the third A layer 25 of the phase shift film 2 using the spectroscopic ellipsometer, and the first layer 21 had a refractive index $n_1$ of 1.990 and an extinction coefficient $k_1$ of 0.085; the second layer 22 had a refractive index $n_2$ of 2.595 and an extinction coefficient $k_2$ of 0.357; and the third A layer 25 had a refractive index $n_{3A}$ of 1.590 and an extinction coefficient $k_{3A}$ of 0.000. A back surface reflectance (reflectance at transparent substrate 1 side) of the phase shift film 2 to a light of a wavelength of an exposure light of an ArF excimer laser was 5.4%, which was below 9%.

Through the above procedure, the mask blank 130 of Example 5 was manufactured, the mask blank 130 having a structure in which the phase shift film 2 including the first layer 21, the second layer 22, and the third A layer 25; the light shielding film 3; and the hard mask film 4 are stacked on the transparent substrate 1. The optical density (OD) to a light of 193 nm wavelength in the stacked structure of the phase shift film 2 and the light shielding film 3 was 3.0 or more.

[Manufacture of Phase Shift Mask]

Next, a phase shift mask 230 of Example 5 was manufactured through the same procedure as Example 1 using the mask blank 130 of Example 5.

Regarding the phase shift mask 230, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask 230 manufactured from the mask blank of Example 5 was set on an exposure apparatus and subjected to exposure transfer by an exposure light of an ArF excimer laser.

EXAMPLE 6

[Manufacture of Mask Blank]

A mask blank 110 of Example 6 was manufactured through the same procedure as Example 1, except for the phase shift film 2. The change in the phase shift film 2 of Example 6 compared to Example 2 is the film thicknesses of the first layer 21 and the second layer 22, and the composition and film thickness of the third layer 23 from those of Example 2. Concretely, a first layer of the phase shift film 2 including silicon, oxygen, and nitrogen (SiON film Si:O:N=40 atom %:35 atom %:25 atom %) was formed in contact with a surface of the transparent substrate 1 at a thickness of 31 nm. The first layer 21 was formed by placing the transparent substrate 1 in a single-wafer RF sputtering apparatus, and by RF sputtering using a silicon (Si) target, using mixed gas of argon (Ar), oxygen ($O_2$), and nitrogen ($N_2$) as sputtering gas. Next, a second layer 22 of the phase shift film 2 including silicon and nitrogen (SiN film Si:N=43 atom %:57 atom %) was formed on the first layer 21 at a thickness of 35 nm. The second layer 22 was formed by reactive sputtering (RF sputtering) using a silicon (Si) target with mixed gas of argon (Ar) and nitrogen ($N_2$) as sputtering gas. Next, a third layer 23 of the phase shift film 2 including silicon, oxygen, and nitrogen (Si:O:N=40 atom %:35 atom %:25 atom %) was formed on the second layer 22 at a thickness of 17 nm. The third layer 23 was formed by reactive sputtering (RF sputtering) using a silicon (Si) target, with mixed gas of argon (Ar), oxygen ($O_2$), and nitrogen ($N_2$) as sputtering gas. By the above procedure, the phase shift film 2 having the first layer 21, the second layer 22, and the third layer 23 stacked in contact with the surface of the transparent substrate 1 was formed at a thickness of 83 nm.

A transmittance and a phase difference of the phase shift film 2 to a light of a wavelength (193 nm wavelength) of an exposure light of an ArF excimer laser were measured using the phase shift measurement apparatus, and a transmittance was 33.4% and a phase difference was 191.5 degrees. Moreover, each optical property was measured for the first layer 21, the second layer 22, and the third layer 23 of the phase shift film 2 using the spectroscopic ellipsometer, and the first layer 21 had a refractive index $n_1$ of 1.990 and an extinction coefficient $k_1$ of 0.085; the second layer 22 had a refractive index $n_2$ of 2.595 and an extinction coefficient $k_2$ of 0.357; and the third layer 23 had a refractive index $n_3$ of 1.990 and an extinction coefficient $k_3$ of 0.085. A back surface reflectance (reflectance at transparent substrate 1 side) of the phase shift film 2 to a light of a wavelength of an exposure light of an ArF excimer laser was 4.7%, which was below 9%.

Through the above procedure, the mask blank 110 of Example 6 was manufactured, the mask blank 110 having a structure in which the phase shift film 2 including the first layer 21, the second layer 22, and the third layer 23; the light shielding film 3; and the hard mask film 4 are stacked on the transparent substrate 1. The optical density (OD) to a light of 193 nm wavelength in the stacked structure of the phase shift film 2 and the light shielding film 3 was 3.0 or more.

[Manufacture of Phase Shift Mask]

Next, a phase shift mask 210 of Example 6 was manufactured through the same procedure as Example 1 using the mask blank 110 of Example 6.

Regarding the phase shift mask 210, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask 210 manufactured from the mask blank of Example 6 was set on an exposure apparatus and subjected to exposure transfer by an exposure light of an ArF excimer laser.

REFERENCE EXAMPLE 1

[Manufacture of Mask Blank]

The mask blank of Reference Example 1 is a reference example of the mask blank of the alternative disclosure. The mask blank of Reference Example 1 was manufactured by the same procedure as Example 1, except for the phase shift film. The phase shift film 2 of Reference Example 1 has a structure where a first B layer, a second B layer, a third B layer, and a fourth B layer are stacked in order from a side of the transparent substrate. The material used to form the first B layer is similar to that of the first layer 21 of Example 1, with a film thickness changed to 31 nm. The material used to form the second B layer is similar to that of the second layer 22 of Example 1, with a film thickness changed to 30 nm. The material used to form the third B layer is similar to that of the first layer 21 of Example 1, with a film thickness changed to 15 nm. The material used to form the fourth B layer is similar to that of the fourth layer 24 of Example 3, with the same film thickness of 3 nm. By the above procedure, the phase shift film having the first B layer, the second B layer, the third B layer, and the fourth B layer stacked in contact with the surface of the transparent substrate was formed at a thickness of 79 nm.

A transmittance and a phase difference of the phase shift film to a light of a wavelength (193 nm wavelength) of an exposure light of an ArF excimer laser were measured using the phase shift measurement apparatus, and a transmittance was 38.5% and a phase difference was 175.1 degrees. A back surface reflectance (reflectance at transparent substrate 1 side) of the phase shift film 2 to a light of a wavelength of an exposure light of an ArF excimer laser was 8.9%, which was below 9%.

Through the above procedure, the mask blank of Reference Example 1 was manufactured, the mask blank having a structure in which the phase shift film including the first B layer, the second B layer, the third B layer, and the fourth B layer; the light shielding film; and the hard mask film are stacked on the transparent substrate. The optical density (OD) to a light of 193 nm wavelength in the stacked structure of the phase shift film and the light shielding film was 3.0 or more.

[Manufacture of Phase Shift Mask]

Next, a phase shift mask of Reference Example 1 was manufactured through the same procedure as Example 1 using the mask blank of Reference Example 1.

Regarding the phase shift mask of Reference Example 1, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, recognizing that the design specification was fully satisfied. Further, no CD variation was found on the exposure transfer image, which is caused by projection of bar codes and alignment marks. It can be considered from the above that exposure transfer can be made on the resist film on the semiconductor device at a high precision, even if the phase shift mask manufactured from the mask blank of Reference Example 1 was set on an exposure apparatus and subjected to exposure transfer by an exposure light of an ArF excimer laser.

COMPARATIVE EXAMPLE 1

[Manufacture of Mask Blank]

A mask blank of Comparative Example 1 was manufactured by the same procedure as Example 1, except for the phase shift film. The phase shift film of Comparative Example 1 is changed to a single layer structure. Concretely, a phase shift film including silicon and nitrogen (SiN film Si:N=43 atom %:57 atom %) was formed in contact with the surface of the transparent substrate at a thickness of 60 nm. The phase shift film was formed by placing the transparent substrate in a single-wafer RF sputtering apparatus, and by reactive sputtering (RF sputtering) using a silicon (Si) target, with mixed gas of argon (Ar) and nitrogen ($N_2$) as sputtering gas.

The optical properties of the phase shift film were measured with the spectroscopic ellipsometer, and a refractive index n was 2.638 and an extinction coefficient k was 0.363. However, when the phase shift film of a single layer structure was adjusted at a phase difference of 178.5 degrees, a transmittance was 18.6%. For an optical density (OD) of the stacked structure of the phase shift film and the light shielding film to an exposure light of an ArF excimer laser to be 3.0 or more, composition and optical properties of the light shielding film were kept unchanged, but the thickness was changed to 55.8 nm. A back surface reflectance of the phase shift film to an exposure light of an Arf excimer laser was 25.8%, significantly exceeding 9%.

By the above procedure, a mask blank of Comparative Example 1 was manufactured, the mask blank having a structure where the phase shift film formed from a single layer structure of SiN, the light shielding film, and the hard mask film are stacked on the transparent substrate. In the mask blank of Comparative Example 1, a back surface reflectance to an exposure light of an ArF excimer laser with the phase shift film and the light shielding film stacked on the transparent substrate was 20.0%, significantly exceeding 9%.

[Manufacture of Phase Shift Mask]

Next, using the mask blank of Comparative Example 1, a phase shift mask of Comparative Example 1 was manufactured through the same procedure as Example 1.

Regarding the half tone phase shift mask of Comparative Example 1 manufactured, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, and CD variation caused by projection of bar codes and alignment marks was observed, which did not satisfy the design specification. It can be considered from this result that a highly precise exposure transfer cannot be made on a resist film on a semiconductor device when the phase shift mask manufactured from the mask blank of Comparative Example 1 was used.

COMPARATIVE EXAMPLE 2

[Manufacture of Mask Blank]

A mask blank of Comparative Example 2 was manufactured by the same procedure as Example 1, except for the phase shift film. The change in the phase shift film of Comparative Example 2 is that the film thicknesses of the first layer, the second layer, and the third layer are changed to 40.0 nm, 35.5 nm, and 3.5 nm, respectively. The thickness of the second layer of the phase shift film 2 is less than the thickness of the first layer. A refractive index and an extinction coefficient of each of the first layer, the second layer, and the third layer of the phase shift film 2 are similar to those of Example 1.

The phase shift film had a phase difference of 176.3 degrees and a transmittance of 19.9%. For the optical density (OD) of the stacked structure of the phase shift film and the light shielding film to a light of 193 nm wavelength to be 3.0 or more, composition and optical properties of the light shielding film were kept unchanged from Example 1 but the thickness was changed to 55.6 nm. A back surface reflectance of the phase shift film to an exposure light of an Arf excimer laser was 12.1%, significantly exceeding 9%.

Through the above procedures, the mask blank of Comparative Example 2 having a structure where the phase shift film, the light shielding film, and the hard mask film are stacked on the transparent substrate was manufactured. In the mask blank of Comparative Example 2, a back surface reflectance to an exposure light of an ArF excimer laser with the phase shift film and the light shielding film stacked on the transparent substrate was 16.9%, significantly exceeding 9%.

[Manufacture of Phase Shift Mask]

Next, a phase shift mask of Comparative Example 2 was manufactured through the same procedure as Example 1 using the mask blank of Comparative Example 2.

Regarding the half tone phase shift mask of Comparative Example 2 manufactured, a simulation of an exposure transfer image was made when an exposure transfer was made on a resist film on a semiconductor device with an exposure light of an ArF excimer laser, using AIMS193 (manufactured by Carl Zeiss). The exposure transfer image obtained by the simulation was inspected, and CD variation caused by projection of bar codes and alignment marks was observed, which did not satisfy the design specification. It can be considered from this result that a highly precise exposure transfer cannot be made on a resist film on a semiconductor device when the phase shift mask manufactured from the mask blank of Comparative Example 2 was used.

DESCRIPTION OF REFERENCE NUMERALS

1 transparent substrate
2 phase shift film
21 first layer
22 second layer
23 third layer
24 fourth layer
25 third A layer
2a phase shift pattern
3 light shielding film
3a, 3b light shielding pattern
4 hard mask film
4a hard mask pattern
5a first resist pattern
6b second resist pattern
100, 110, 120, 130 mask blank
200, 210, 220, 230 phase shift mask

The invention claimed is:

1. A mask blank comprising a phase shift film on a transparent substrate,
    wherein the phase shift film comprises:
        a first layer that is provided in contact with a surface of the transparent substrate and has a film thickness $d_1$, the first layer contains silicon, nitrogen, and oxygen, and
        a second layer that is provided on the first layer and has a film thickness $d_2$ which is greater than $d_1$, and
    wherein, at a wavelength of 193 nm:
        the first layer has a refractive index $n_1$ and an extinction coefficient $k_1$, and
        the second layer has a refractive index $n_2$ that is greater than $n_1$ and an extinction coefficient $k_2$ that is greater than $k_1$.

2. The mask blank according to claim 1, wherein the refractive index $n_1$ of the first layer is 1.8 or more and the extinction coefficient $k_1$ of the first layer is 0.15 or less.

3. The mask blank according to claim 1, wherein the refractive index $n_2$ of the second layer is 2.2 or more and the extinction coefficient $k_2$ of the second layer is 0.2 or more.

4. The mask blank according to claim 1,
    wherein, at the wavelength of 193 nm, the transparent substrate has a refractive index $n_s$ that is less than $n_1$ and an extinction coefficient $k_s$ that is less than $k_1$.

5. The mask blank according to claim 4, wherein the refractive index $n_s$ of the transparent substrate is 1.6 or less and the extinction coefficient $k_s$ of the transparent substrate is 0.01 or less.

6. The mask blank according to claim 1, wherein a transmittance of the phase shift film with respect to a light having a wavelength of 193 nm is 15% or more, and
    wherein the phase shift film is configured to transmit the light so that transmitted light has a phase difference of 150 degrees or more and 200 degrees or less with respect to the light transmitted through air for a same distance as a thickness of the phase shift film.

7. The mask blank according to claim 1,
    wherein the second layer contains silicon and nitrogen.

8. The mask blank according to claim 7, wherein a nitrogen content of the second layer is more than a nitrogen content of the first layer.

9. The mask blank according to claim 1, wherein the phase shift film comprises a third layer on the second layer, and
    wherein, at the wavelength of 193 nm, the third layer has a refractive index $n_3$ that is less than $n_1$ and an extinction coefficient $k_s$ that is greater than $k_2$.

10. The mask blank according to claim 9, wherein a film thickness $d_3$ of the third layer is less than $d_1$.

11. The mask blank according to claim 9, wherein the refractive index $n_3$ of the third layer is less than 1.8, and the extinction coefficient $k_3$ of the third layer is 1.0 or more.

12. The mask blank according to claim 9, wherein the third layer contains silicon and nitrogen.

13. The mask blank according to claim 9, wherein the phase shift film comprises a fourth layer on the third layer, and
    wherein, at the wavelength of 193 nm, the fourth layer has a refractive index $n_4$ that is less than $n_1$ and an extinction coefficient $k_4$ that is less than $k_1$.

14. The mask blank according to claim 13, wherein the refractive index $n_4$ of the fourth layer is 1.7 or less and the extinction coefficient $k_4$ of the fourth layer is 0.02 or less.

15. The mask blank according to claim 13, wherein the fourth layer contains silicon and oxygen.

16. The mask blank according to claim 1, wherein the phase shift film comprises a third A layer on the second layer,
   wherein, at the wavelength of 193 nm, the third A layer has a refractive index $n_{3A}$ that is less than $n_1$ and an extinction coefficient $k_{3A}$ that is less than $k_1$.

17. The mask blank according to claim 16, wherein the refractive index $n_{3A}$ of the third A layer is 1.7 or less, and the extinction coefficient $k_{3A}$ of the third A layer is 0.02 or less.

18. The mask blank according to claim 16, wherein the third A layer contains silicon and oxygen.

19. A phase shift mask provided with a transfer pattern on the phase shift film of the mask blank according to claim 1.

20. A method of manufacturing a semiconductor device comprising using the phase shift mask according to claim 19 and subjecting a resist film on a semiconductor substrate to exposure-transfer of a transfer pattern.

* * * * *